United States Patent
Kujirai

(10) Patent No.: US 8,426,903 B2
(45) Date of Patent: Apr. 23, 2013

(54) SEMICONDUCTOR DEVICE AND METHOD OF MANUFACTURING SAME

(75) Inventor: Hiroshi Kujirai, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 128 days.

(21) Appl. No.: 12/978,975

(22) Filed: Dec. 27, 2010

(65) Prior Publication Data

US 2011/0156120 A1 Jun. 30, 2011

(30) Foreign Application Priority Data

Dec. 28, 2009 (JP) ................................. 2009-297229

(51) Int. Cl.
*H01L 27/108* (2006.01)
(52) U.S. Cl.
USPC ................. 257/301; 257/302; 257/E27.084
(58) Field of Classification Search ........................ None
See application file for complete search history.

(56) References Cited

U.S. PATENT DOCUMENTS

| 2001/0000918 A1* | 5/2001 | Forbes et al. ................. 257/301 |
| 2007/0190766 A1* | 8/2007 | Seo et al. ...................... 438/585 |
| 2008/0296671 A1 | 12/2008 | Takaishi |
| 2009/0213648 A1 | 8/2009 | Slesazeck |
| 2010/0052029 A1* | 3/2010 | Huang ......................... 257/309 |

FOREIGN PATENT DOCUMENTS

JP 2009-010366 1/2009

* cited by examiner

*Primary Examiner* — Fei Fei Yeung Lopez
(74) *Attorney, Agent, or Firm* — Young & Thompson

(57) ABSTRACT

There are provided: a silicon pillar that is formed almost perpendicularly to a main surface of a substrate; first and second impurity diffused layers that are arranged in a lower part and an upper part of the silicon pillar, respectively; a gate electrode that is arranged horizontally through the silicon pillar; and a gate insulating film that is arranged between the gate electrode and the silicon pillar. The silicon pillar consequently has a small volume, which makes it possible to reduce the leak current of the transistor or thyristor formed in the silicon pillar.

20 Claims, 62 Drawing Sheets

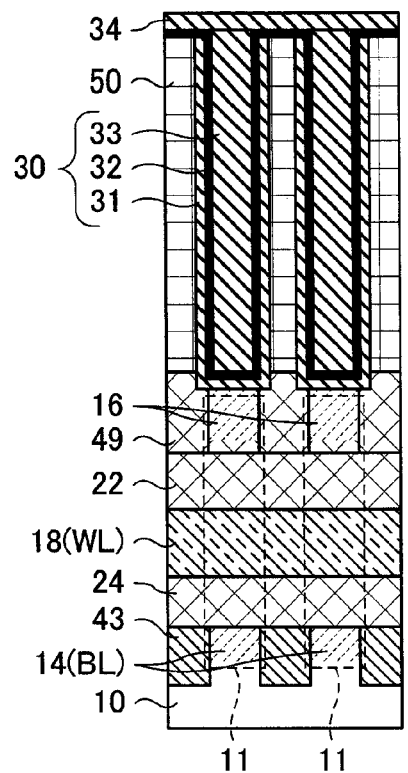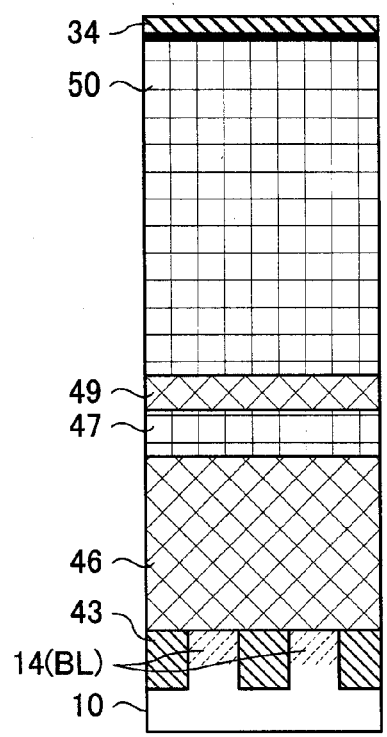
FIG.2A  FIG.2B
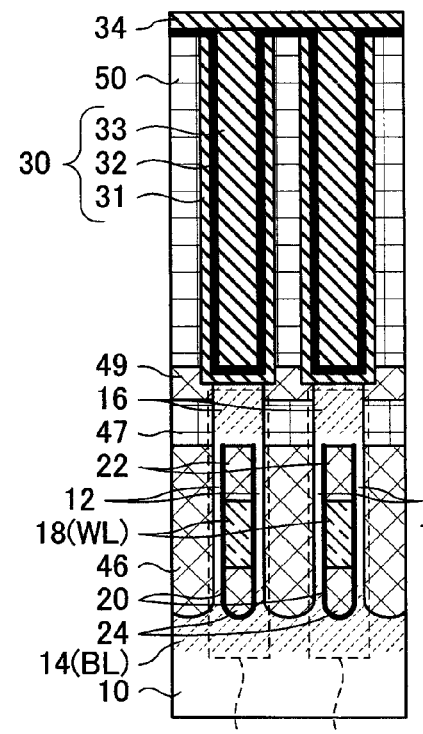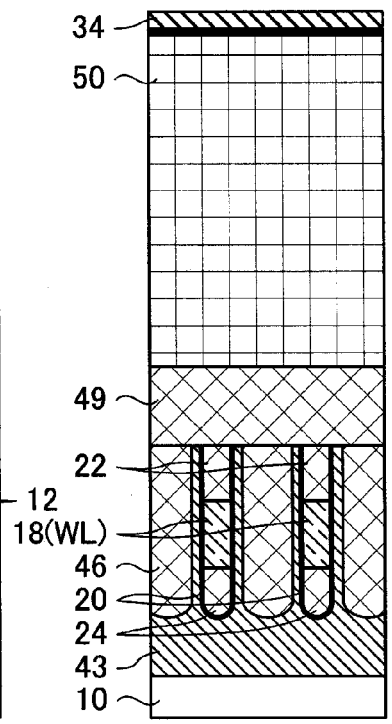
FIG.2C  FIG.2D

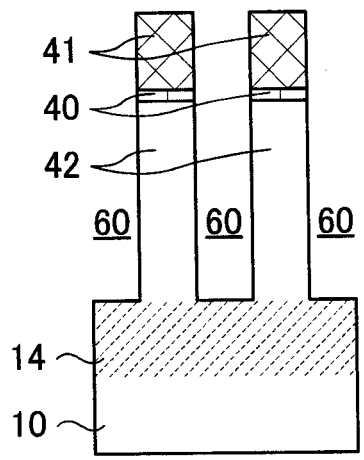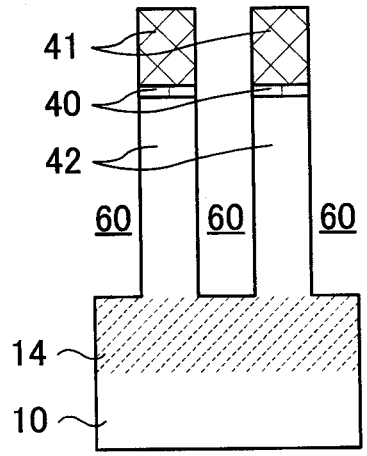
FIG.5A  FIG.5B
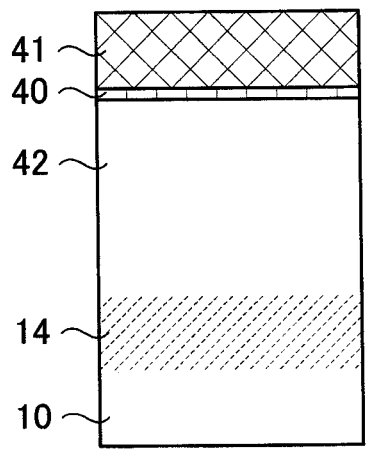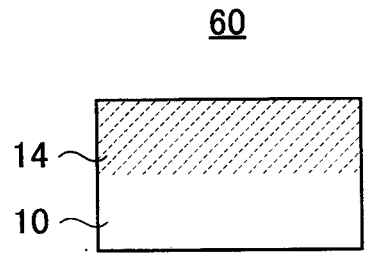
FIG.5C  FIG.5D

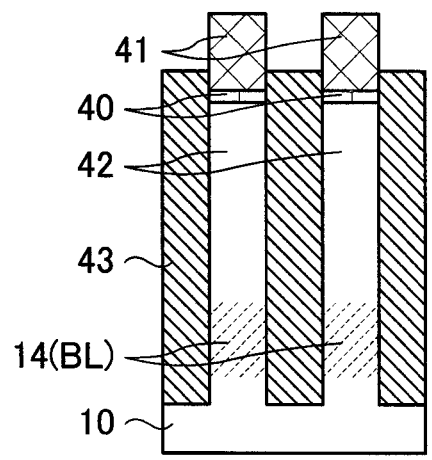
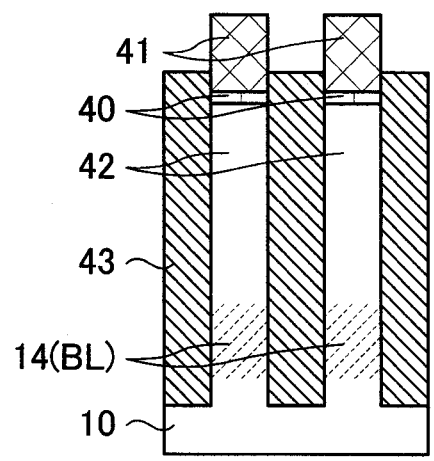
FIG.9A  FIG.9B
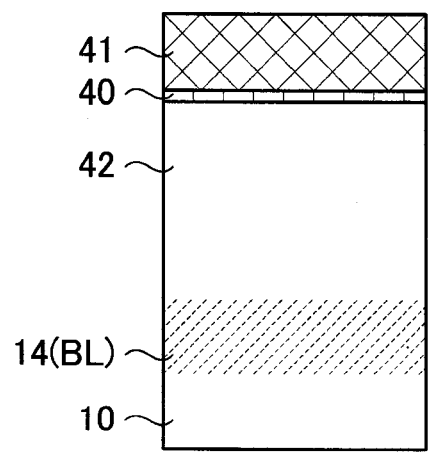
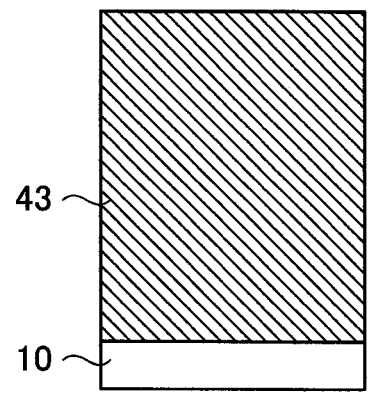
FIG.9C  FIG.9D

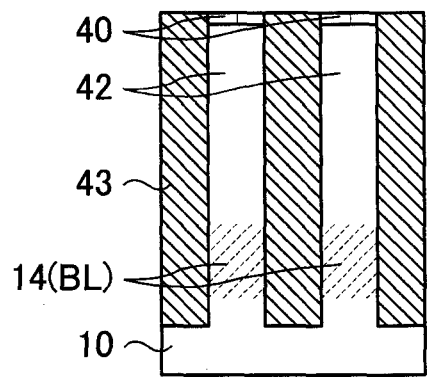
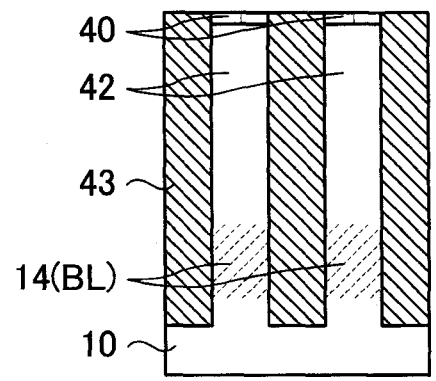
FIG.11A  FIG.11B
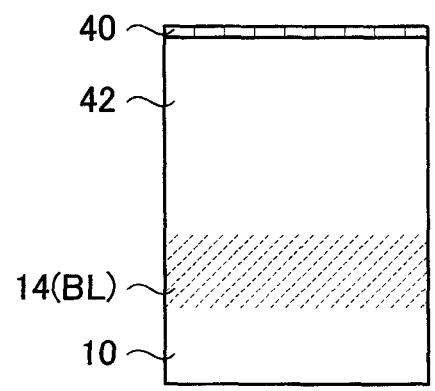
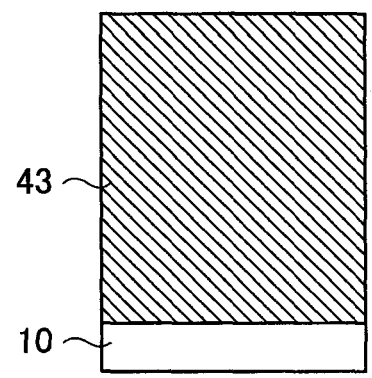
FIG.11C  FIG.11D

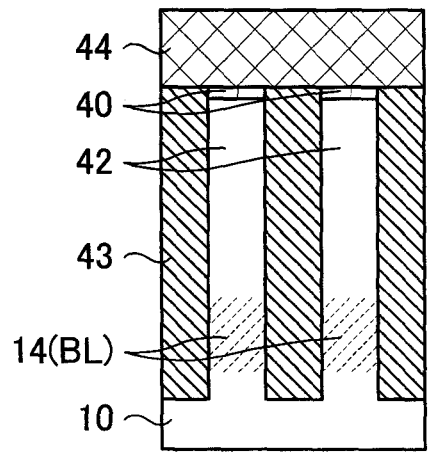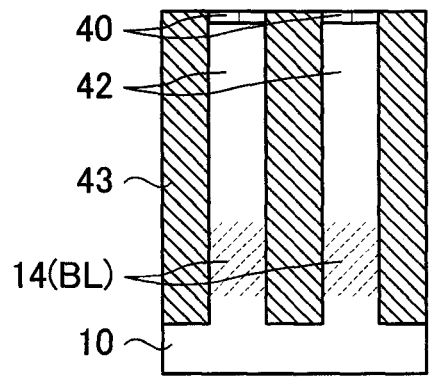
FIG.13A    FIG.13B
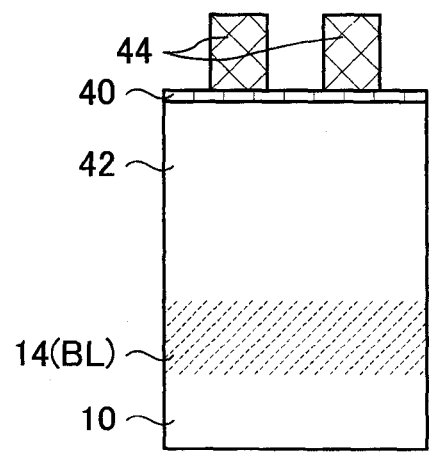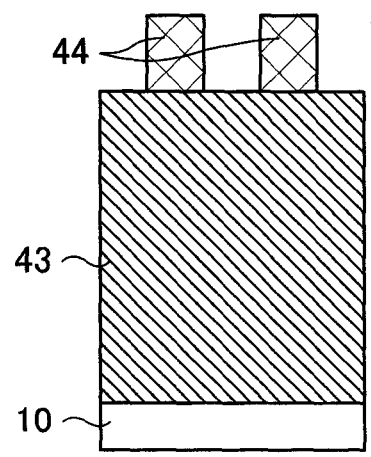
FIG.13C    FIG.13D

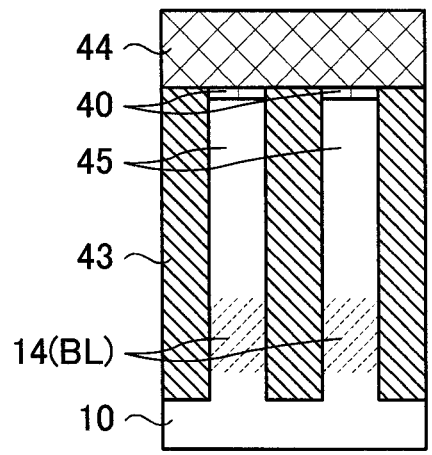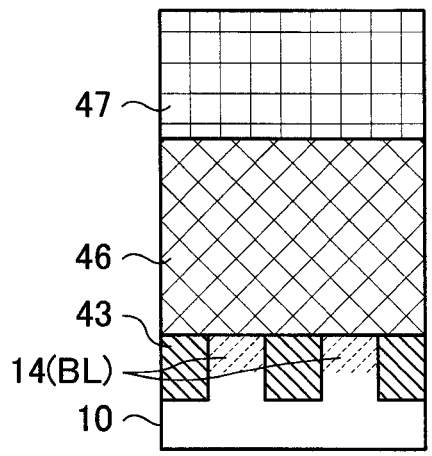
FIG.17A  FIG.17B
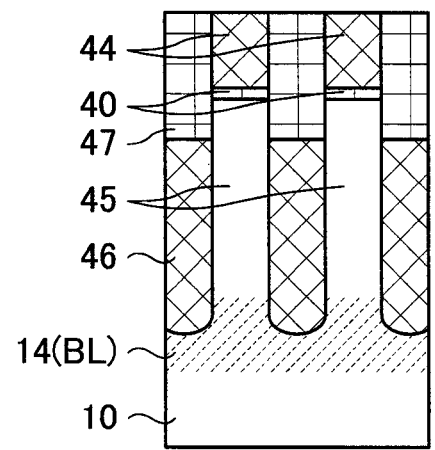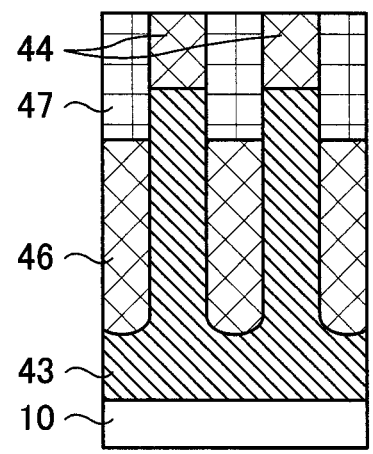
FIG.17C  FIG.17D

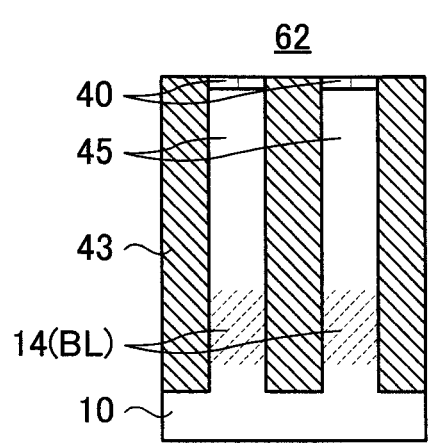
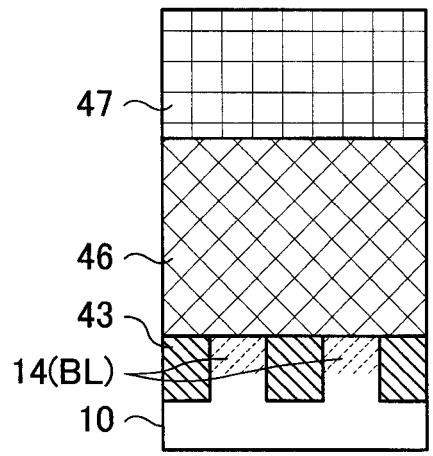
FIG.19A    FIG.19B
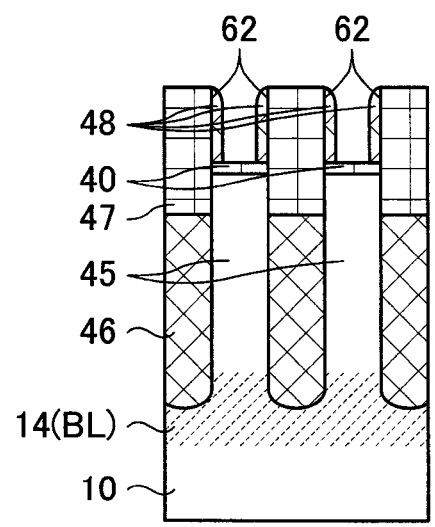
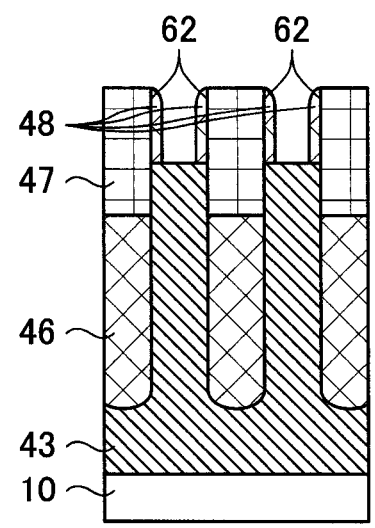
FIG.19C    FIG.19D

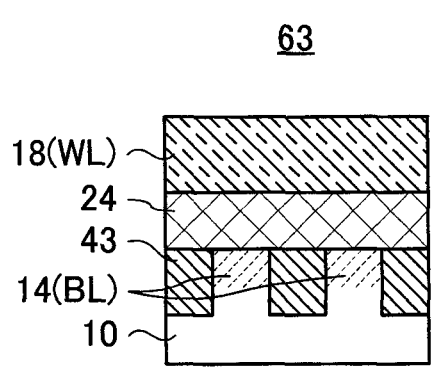
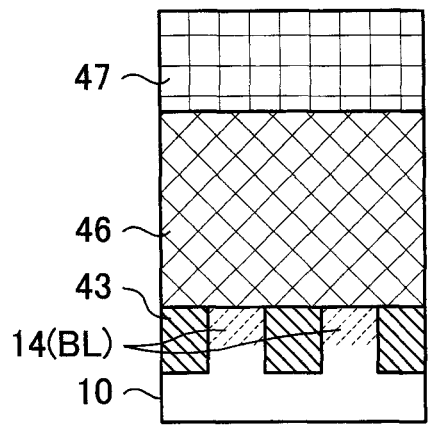
FIG.23A  FIG.23B
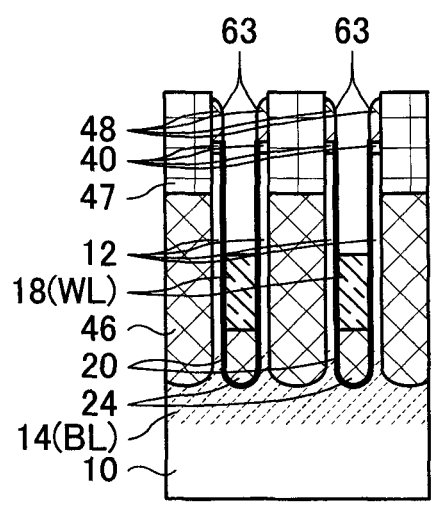
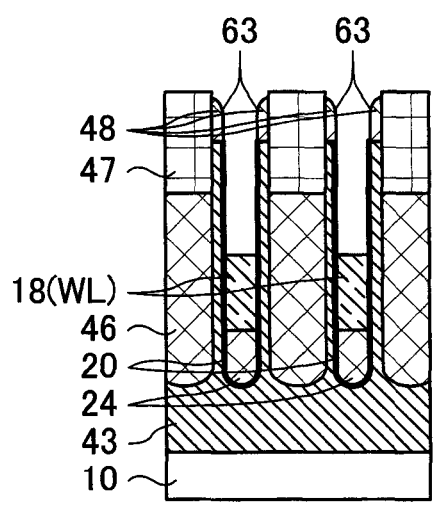
FIG.23C  FIG.23D

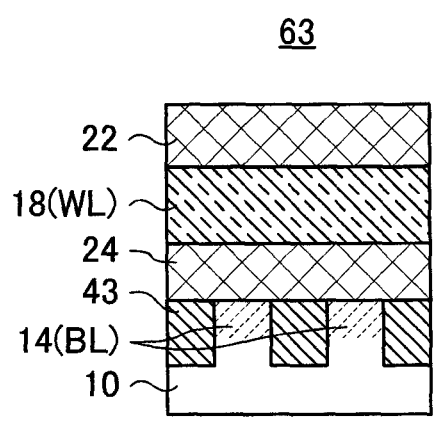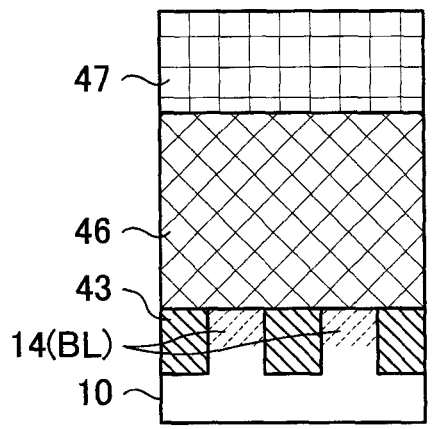
FIG.25A  FIG.25B
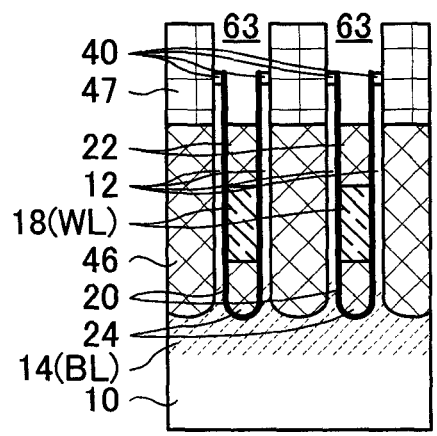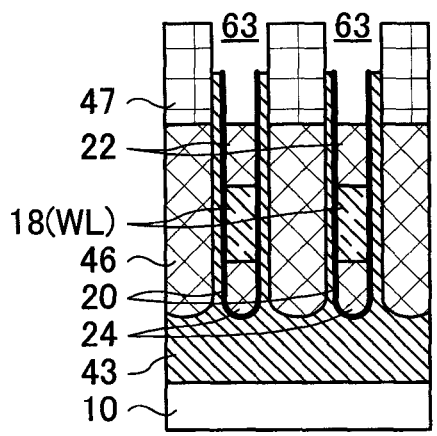
FIG.25C  FIG.25D

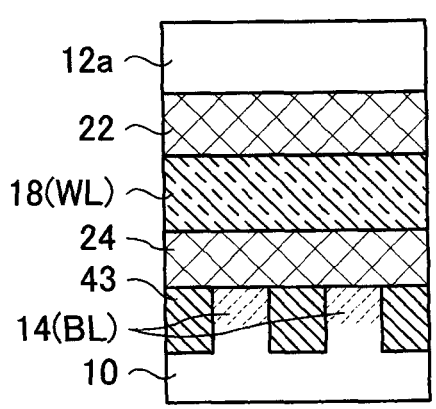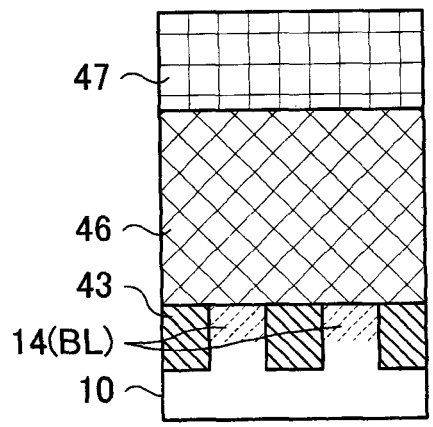
FIG.27A  FIG.27B
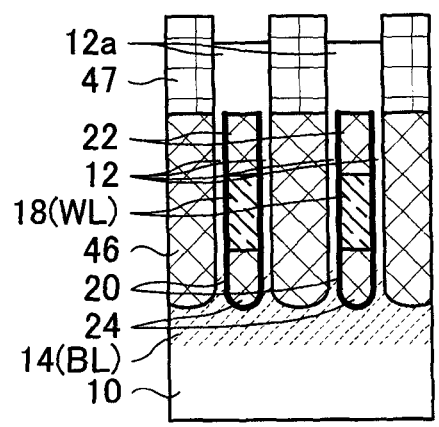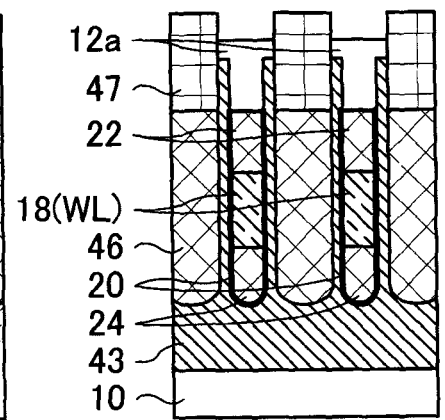
FIG.27C  FIG.27D

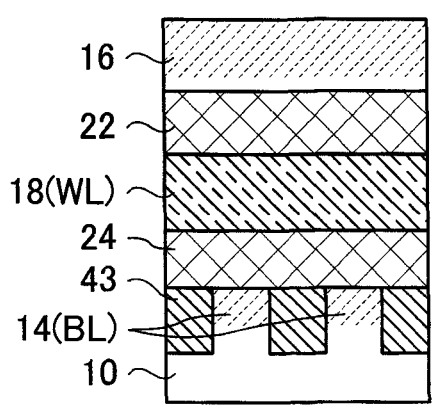 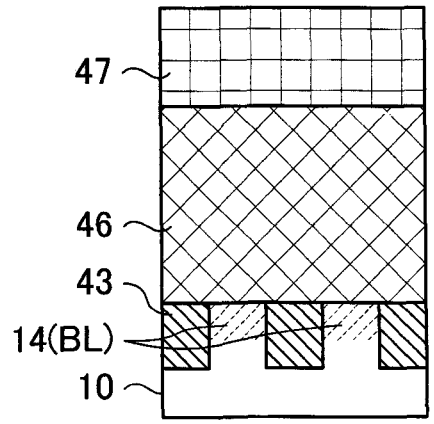
FIG.29A    FIG.29B
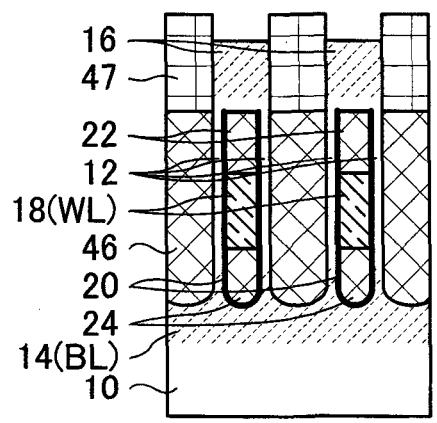 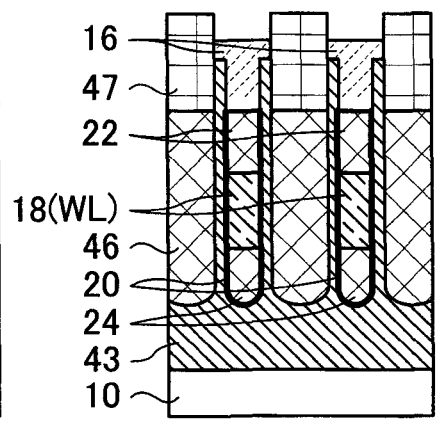
FIG.29C    FIG.29D

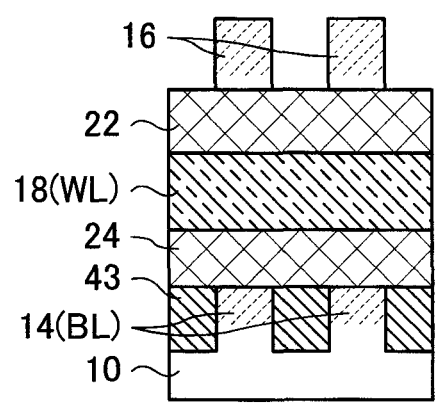
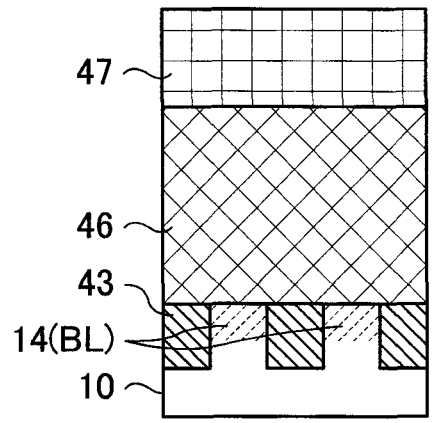
FIG.31A　　　FIG.31B
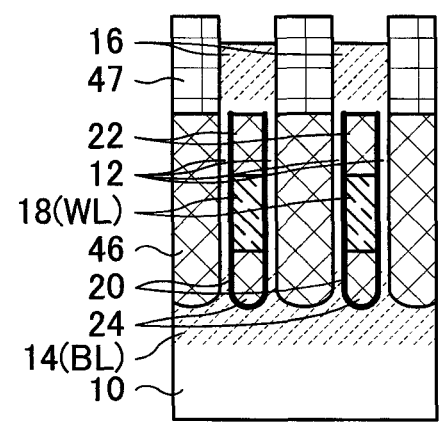
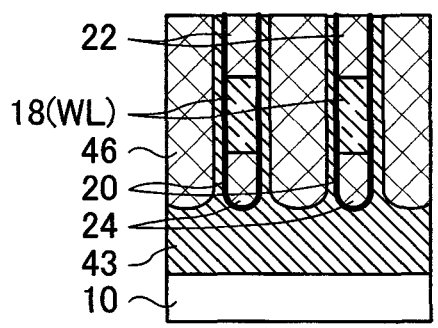
FIG.31C　　　FIG.31D

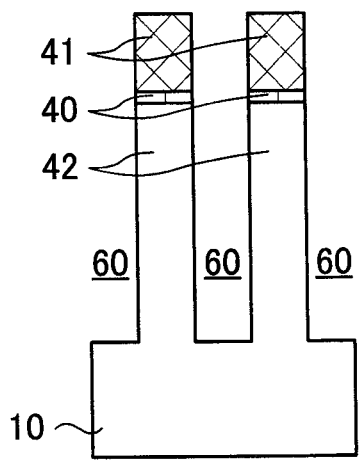
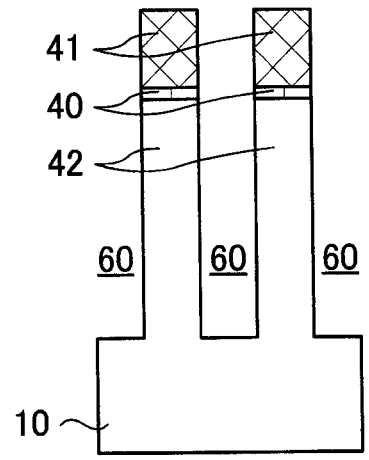
FIG.36A        FIG.36B
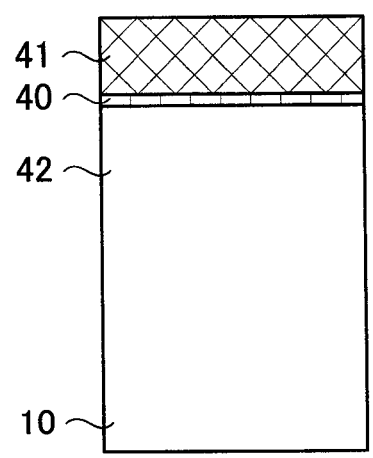
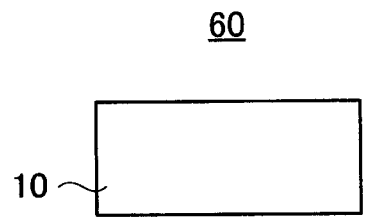
FIG.36C        FIG.36D

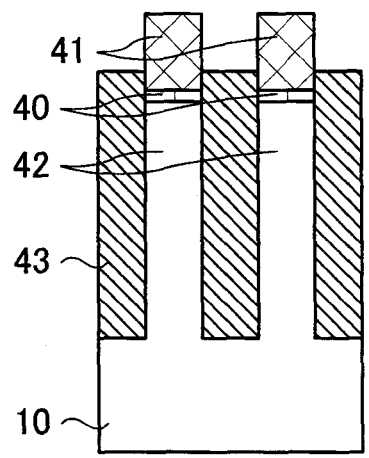
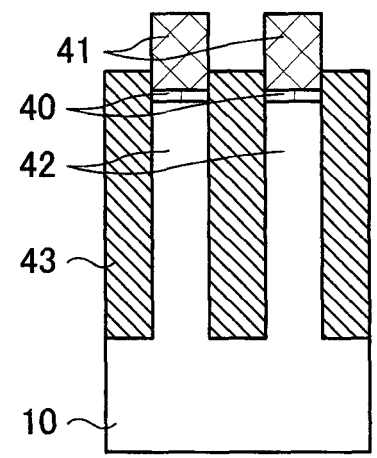
FIG.38A　　　　FIG.38B
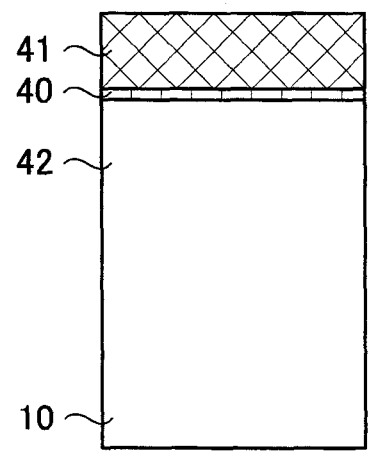
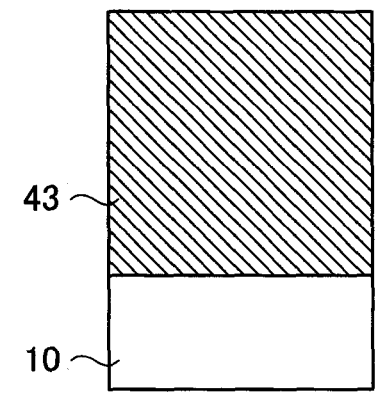
FIG.38C　　　　FIG.38D

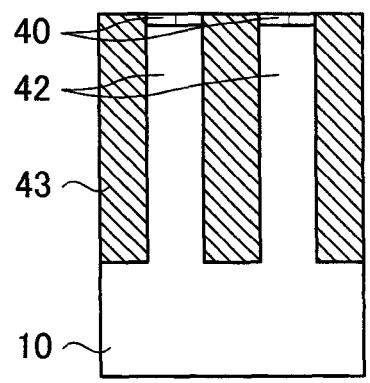
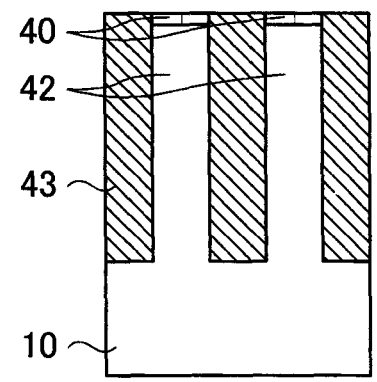
FIG.40A   FIG.40B
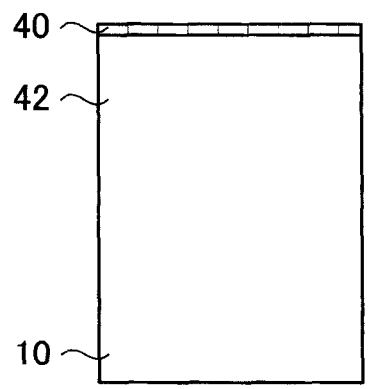
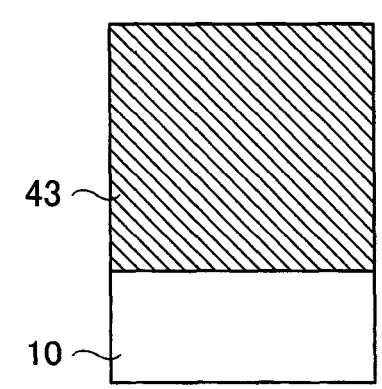
FIG.40C   FIG.40D

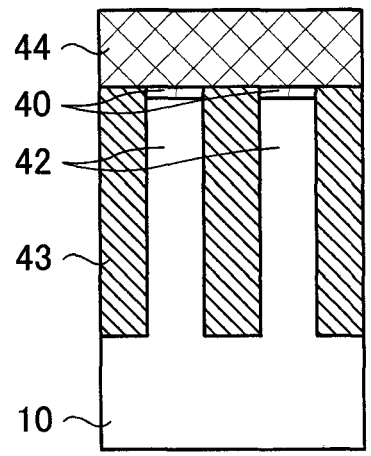
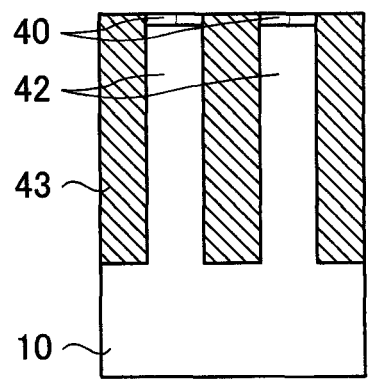
FIG.42A    FIG.42B
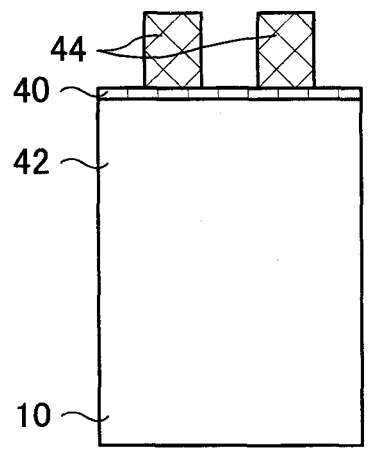
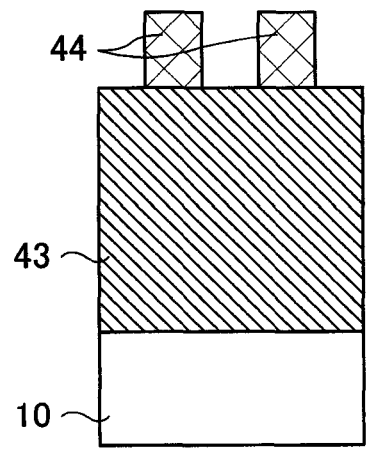
FIG.42C    FIG.42D

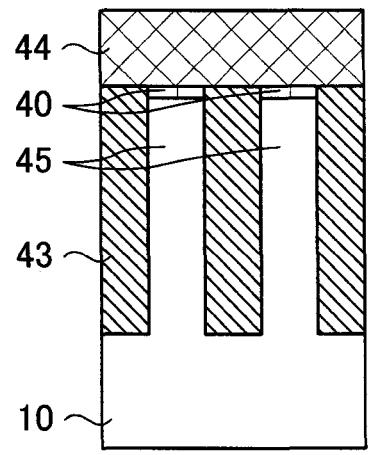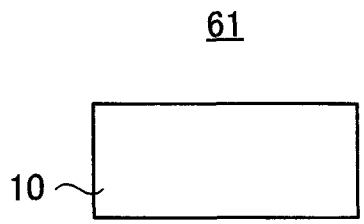
FIG.44A  FIG.44B
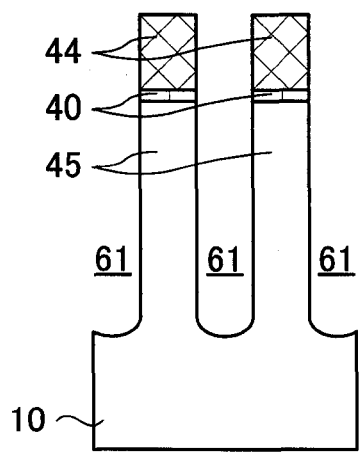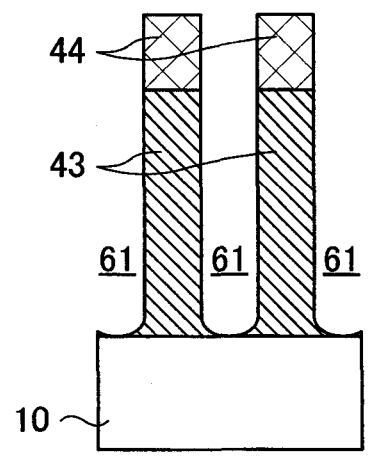
FIG.44C  FIG.44D

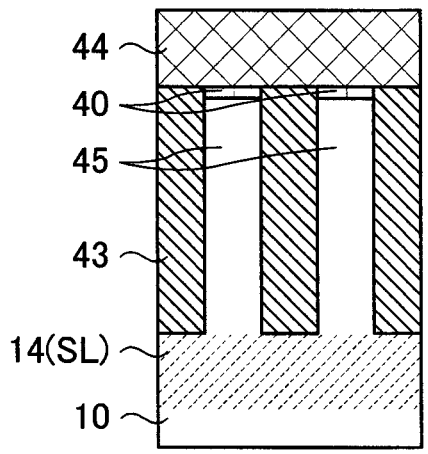
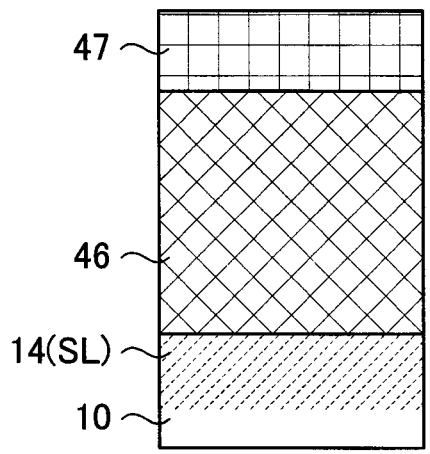
FIG.48A  FIG.48B
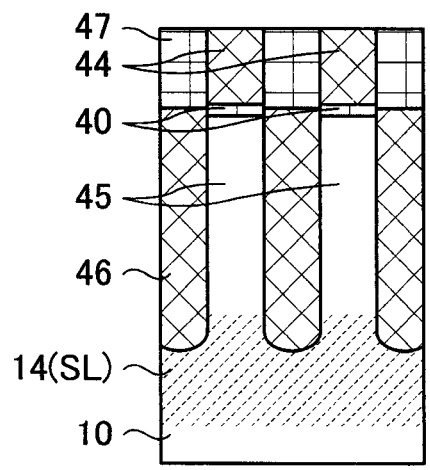
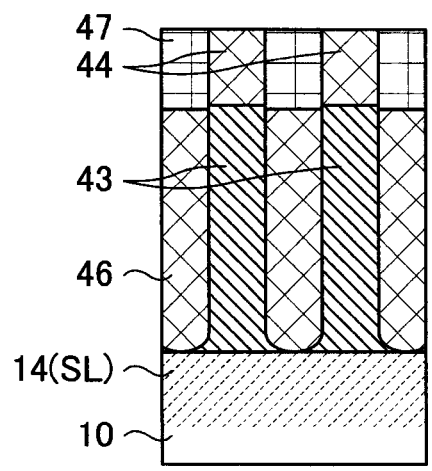
FIG.48C  FIG.48D

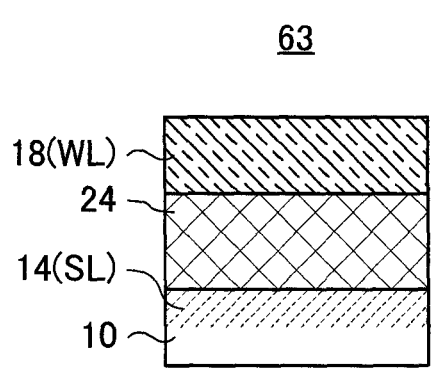
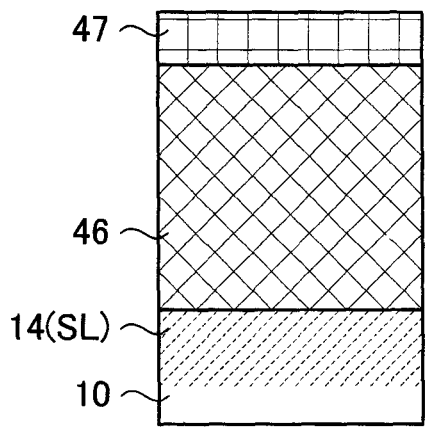
FIG.54A  FIG.54B
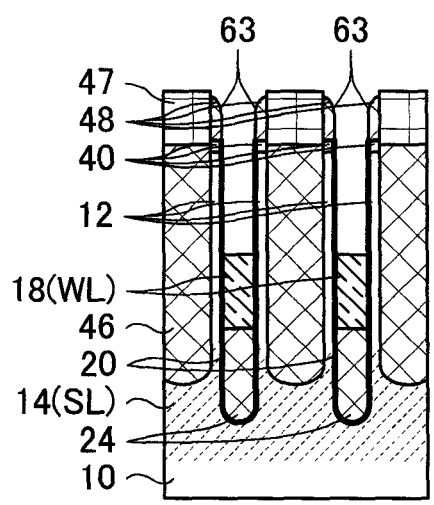
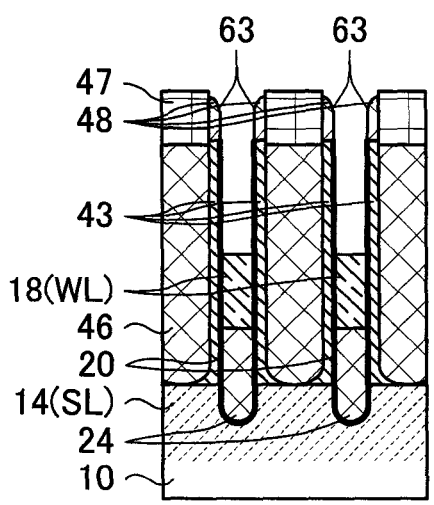
FIG.54C  FIG.54D

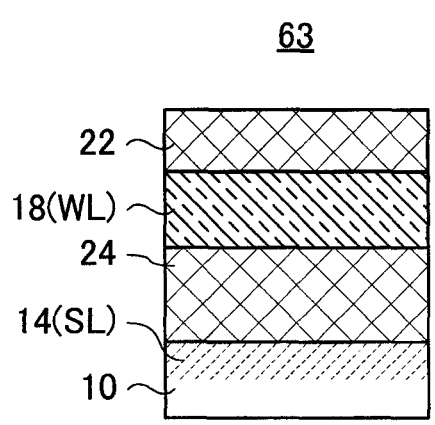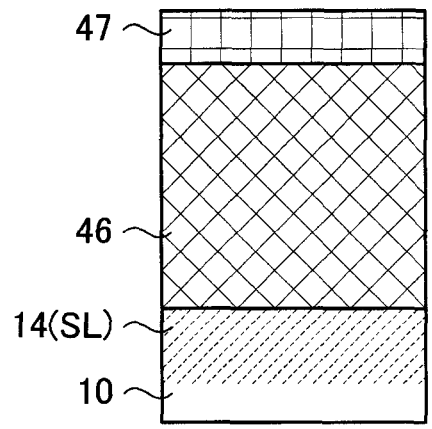
FIG.56A  FIG.56B
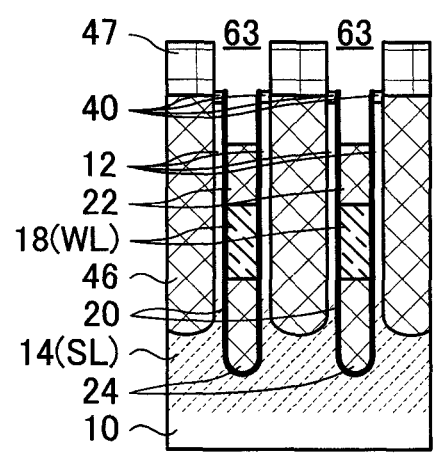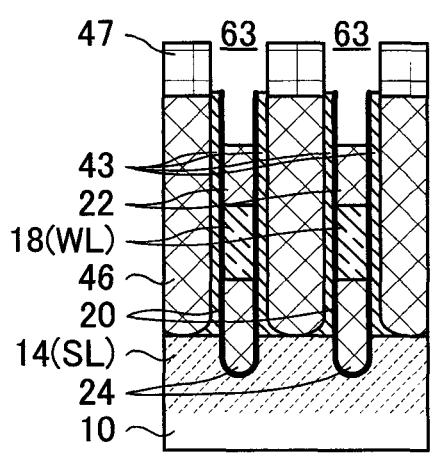
FIG.56C  FIG.56D

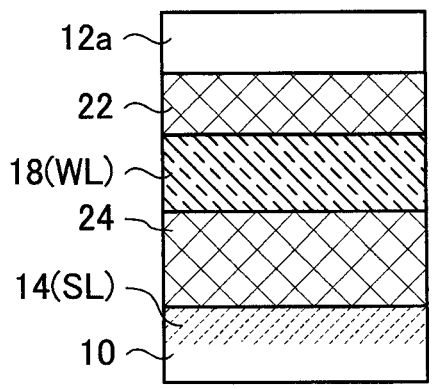
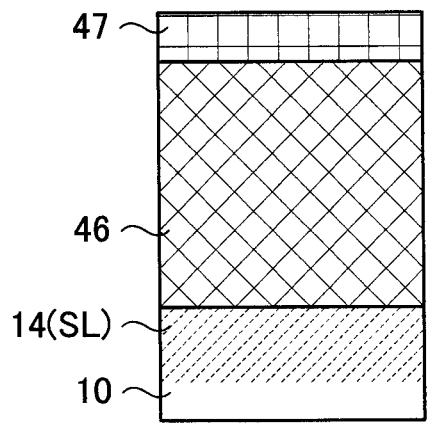
FIG.58A  FIG.58B
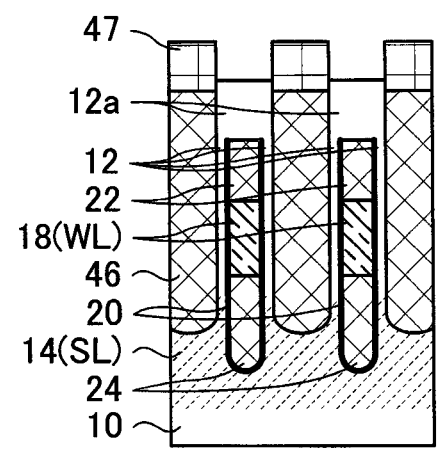
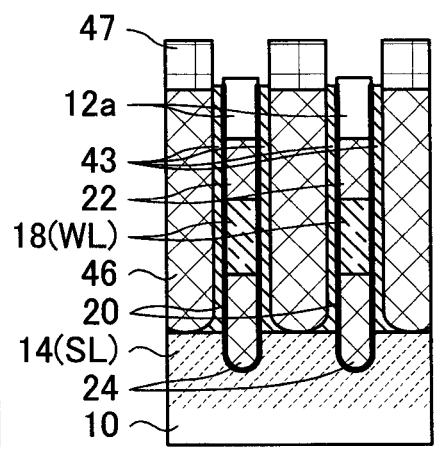
FIG.58C  FIG.58D

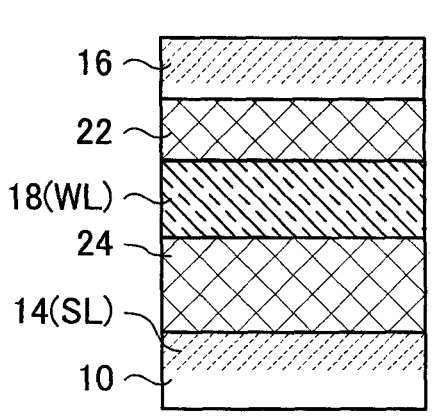 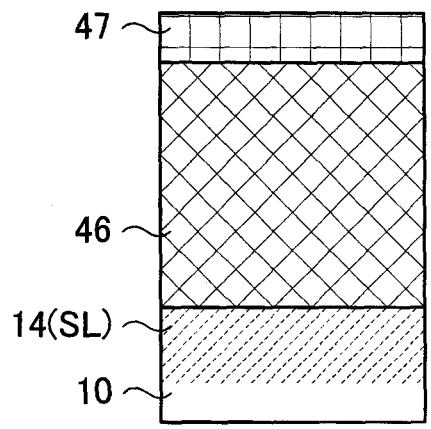
FIG.60A  FIG.60B
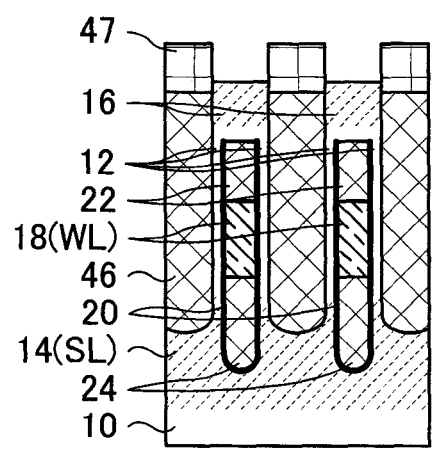 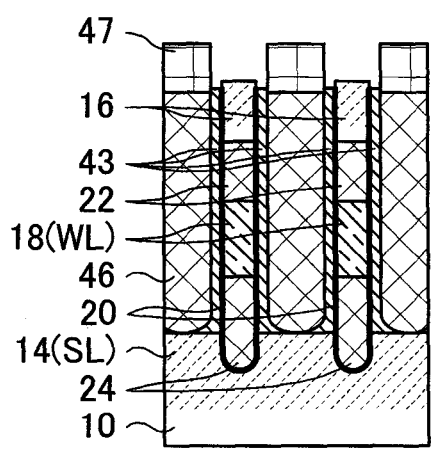
FIG.60C  FIG.60D

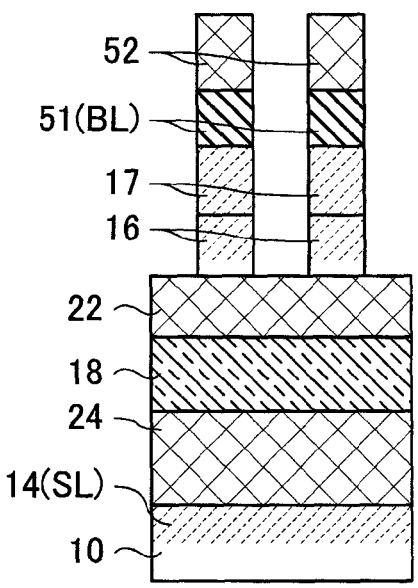
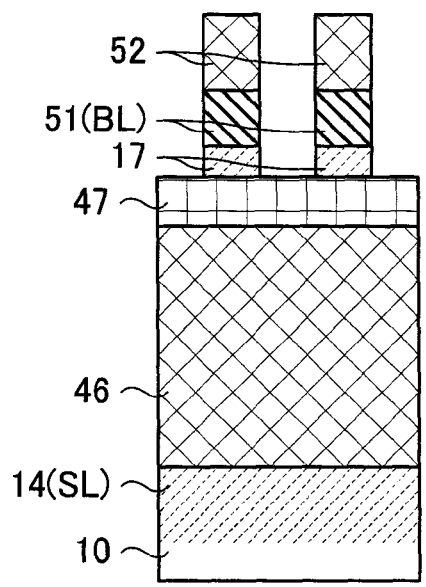
FIG.62A  FIG.62B
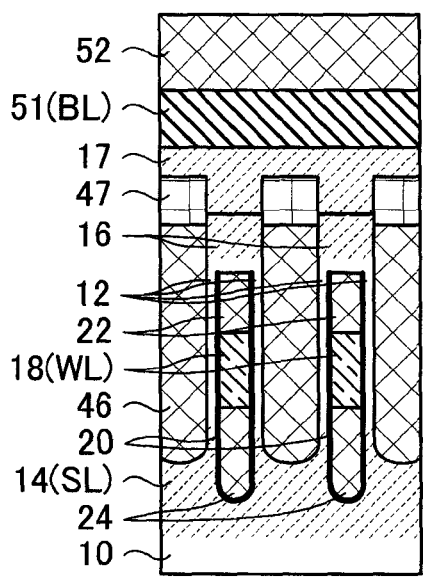
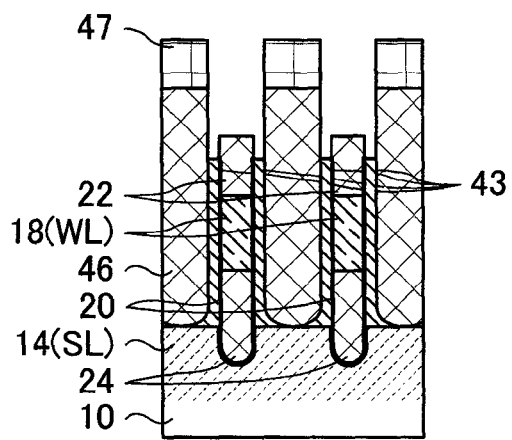
FIG.62C  FIG.62D

SEMICONDUCTOR DEVICE AND METHOD OF MANUFACTURING SAME

BACKGROUND OF THE INVENTION

1. Field of the Invention

The present invention relates to a semiconductor device and a method of manufacturing the same, and more particularly to a semiconductor device that uses three-dimensionally formed transistors or thyristors and a method of manufacturing the same.

2. Description of Related Art

The scale of integration of semiconductor devices has conventionally been enhanced mostly by miniaturizing transistors. The miniaturization of the transistors is already reaching its limit, and a further reduction in transistor size may possibly hinder proper operation due to a short channel effect etc.

As a fundamental solution to such a problem, there have been proposed methods for spatially processing a semiconductor substrate to form the transistors in a three-dimensional fashion. In particular, three-dimensional transistors that use silicon pillars extending in a direction perpendicular to the main surface of the semiconductor substrate as their channels have the advantages of having a small area of occupancy and providing a high drain current because of complete depletion. A closest-packed layout of $4F^2$ (F is the minimum processing size) is also available (see Jpn. Pat. Appln. Laid-Open Publication No. 2009-010366).

Conventionally, semiconductor devices, or a DRAM (Dynamic Random Access Memory) in particular, have typically used capacitors for information storage. The enhanced scale of integration miniaturizes the capacitors, making it difficult to secure the capacitances of the capacitors. There has recently been proposed a capacitorless DRAM in which memory cells are formed without a capacitor. U.S. Pat. Appln. Publication No. 2009-0213648 discloses an example of a capacitorless DRAM which is composed of three-dimensionally formed thyristors.

SUMMARY

The semiconductor devices using three-dimensionally formed transistors or thyristors store smaller amounts of electric charge in the capacitors or thyristors than heretofore because of the miniaturization. This increases the influence of leak currents on the information retention characteristics. It has thus been desired to reduce the leak currents of the transistors and thyristors.

In one embodiment, there is provided a semiconductor device comprising: a silicon pillar that is projected to substantially perpendicularly to a main surface of a semiconductor substrate; first and second impurity diffusion layers that are formed in a lower part and an upper part of the silicon pillar, respectively; a gate electrode that penetrates through the silicon pillar in a direction parallel to the main surface of the semiconductor substrate; and a gate insulating film that is formed between the gate electrode and the silicon pillar.

In another embodiment, there is provided a method of manufacturing a semiconductor device, comprising: etching a silicon substrate by using a mask insulating film to form a silicon pillar, and forming a first impurity diffused layer in a lower part of the silicon pillar; depositing a first insulating film so as to fill a periphery of the silicon pillar and the mask insulating film; removing the mask insulating film; forming a sidewall insulating film on an inner wall of a first opening that is formed by the removal of the mask insulating film; etching the silicon pillar by using the sidewall insulating film and the first insulating film as a mask; forming a gate insulating film by oxidizing an inner wall of a second opening that is formed by the etching of the silicon pillar; forming a gate electrode in the second opening, at least an upper part of the gate electrode being covered by a second insulating film; and forming a second impurity diffused layer that is in contact with an upper end of the silicon pillar and an upper end of the second insulating film.

According to the present invention, the silicon pillar has a small volume, which makes it possible to reduce the leak current of the transistor or thyristor formed in the silicon pillar.

BRIEF DESCRIPTION OF THE DRAWINGS

The above features and advantages of the present invention will be more apparent from the following description of certain preferred embodiments taken in conjunction with the accompanying drawings, in which:

FIGS. 2A to 2D are sectional views corresponding to the cross sections taken along lines A-A, B-B, C-C, and D-D of FIG. 1, respectively;

FIGS. 5A to 5D are sectional views corresponding to the cross sections taken along lines A-A, B-B, C-C, and D-D of FIG. 4, respectively;

FIGS. 9A to 9D are sectional views corresponding to the cross sections taken along lines A-A, B-B, C-C, and D-D of FIG. 8, respectively;

FIGS. 11A to 11D are sectional views corresponding to the cross sections taken along lines A-A, B-B, C-C, and D-D of FIG. 10, respectively;

FIGS. 13A to 13D are sectional views corresponding to the cross sections taken along lines A-A, B-B, C-C, and D-D of FIG. 12, respectively;

FIGS. 17A to 17D are sectional views corresponding to the cross sections taken along lines A-A, B-B, C-C, and D-D of FIG. 16, respectively;

FIGS. 19A to 19D are sectional views corresponding to the cross sections taken along lines A-A, B-B, C-C, and D-D of FIG. 18, respectively;

FIGS. 21A to 22D are sectional views corresponding to the cross sections taken along lines A-A, B-B, C-C, and D-D of FIG. 20, respectively;

FIG. 22 is a plan view of the semiconductor device according to the first embodiment and shows a fabrication process of the semiconductor device;

FIGS. 23A to 23D are sectional views corresponding to the cross sections taken along lines A-A, B-B, C-C, and D-D of FIG. 22, respectively;

FIGS. 25A to 25D are sectional views corresponding to the cross sections taken along lines A-A, B-B, C-C, and D-D of FIG. 24, respectively;

FIGS. 27A to 27D are sectional views corresponding to the cross sections taken along lines A-A, B-B, C-C, and D-D of FIG. 26, respectively;

FIGS. 29A to 29D are sectional views corresponding to the cross sections taken along lines A-A, B-B, C-C, and D-D of FIG. 28, respectively;

FIGS. 31A to 31D are sectional views corresponding to the cross sections taken along lines A-A, B-B, C-C, and D-D of FIG. 30, respectively;

FIGS. 36A to 36D are sectional views corresponding to the cross sections taken along lines A-A, B-B, C-C, and D-D of FIG. 35, respectively;

FIGS. 38A to 38D are sectional views corresponding to the cross sections taken along lines A-A, B-B, C-C, and D-D of FIG. 37, respectively;

FIGS. 40A to 40D are sectional views corresponding to the cross sections taken along lines A-A, B-B, C-C, and D-D of FIG. 39, respectively;

FIGS. 42A to 42D are sectional views corresponding to the cross sections taken along lines A-A, B-B, C-C, and D-D of FIG. 41, respectively;

FIGS. 44A to 44D are sectional views corresponding to the cross sections taken along lines A-A, B-B, C-C, and D-D of FIG. 43, respectively;

FIGS. 48A to 48D are sectional views corresponding to the cross sections taken along lines A-A, B-B, C-C, and D-D of FIG. 47, respectively;

FIGS. 54A to 54D are sectional views corresponding to the cross sections taken along lines A-A, B-B, C-C, and D-D of FIG. 53, respectively;

FIGS. 56A to 56D are sectional views corresponding to the cross sections taken along lines A-A, B-B, C-C, and D-D of FIG. 55, respectively;

FIGS. 58A to 58D are sectional views corresponding to the cross sections taken along lines A-A, B-B, C-C, and D-D of FIG. 57, respectively;

FIGS. 60A to 60D are sectional views corresponding to the cross sections taken along lines A-A, B-B, C-C, and D-D of FIG. 59, respectively;

FIGS. 62A to 62D are sectional views corresponding to the cross sections taken along lines A-A, B-B, C-C, and D-D of FIG. 61, respectively.

DETAILED DESCRIPTION OF THE EMBODIMENTS

Preferred embodiments of the present invention will be explained below in detail with reference to the accompanying drawings.

Figure 1:
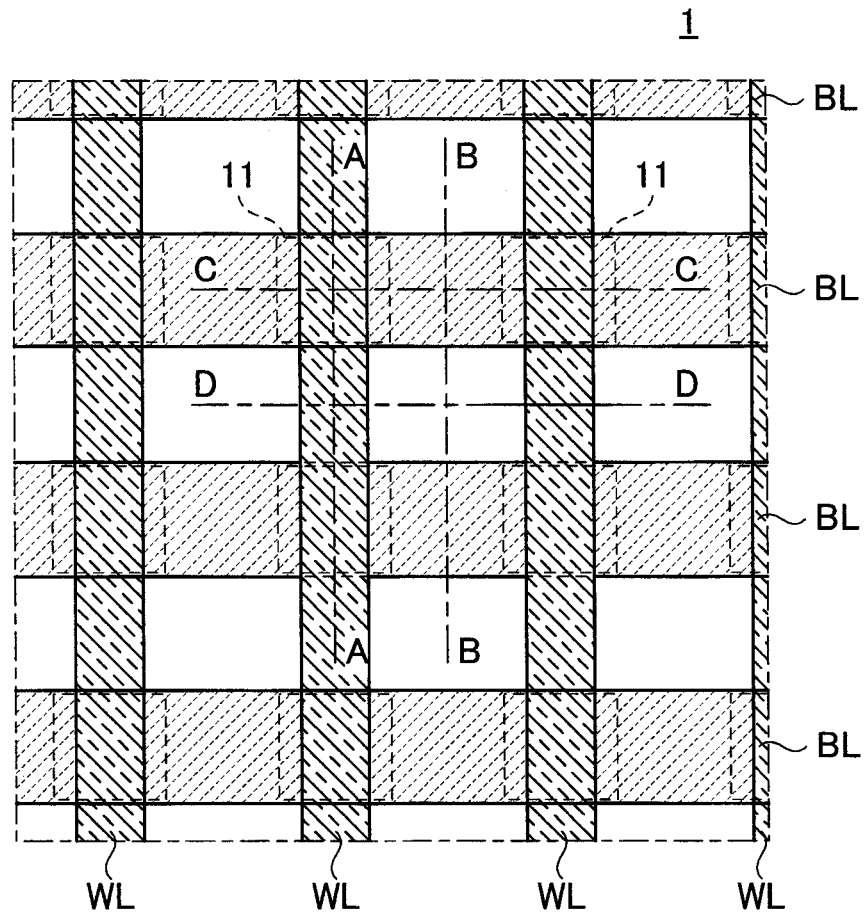
FIG. 1 is a plan view of a semiconductor device according to a first embodiment of the present invention.

FIG. 1 is a plan view of a semiconductor device 1 according to a first embodiment of the present invention. Note that the diagram also shows the positions of word lines WL and bit lines BL which do not actually appear in the surface. FIGS. 2A to 2D are sectional views corresponding to the cross sections taken along lines A-A, B-B, C-C, and D-D of FIG. 1, respectively.

The semiconductor device 1 according to the present embodiment is a semiconductor memory device (DRAM) using memory cell capacitors. The semiconductor device 1 is formed in and over a P-type (second conductivity type) area PWELL (not shown) which is formed in the surface of a silicon substrate 10.

As shown in FIG. 1, the semiconductor device 1 includes a plurality of word lines WL which extend in a vertical direction in the diagram, and a plurality of bit lines BL which extend in a horizontal direction in the diagram. The plurality of word lines WL and the plurality of bit lines BL are both arranged at intervals (center distances) of 2F. Cell transistors 11 (MOS transistors) are arranged at the intersections of the word lines WL and the bit lines BL.

The cell transistors 11 include silicon pillars 12 which are formed almost perpendicularly to the main surface of the silicon substrate 10.

As shown in FIGS. 2A to 2D, an interlayer insulating film 46 made of an insulator such as silicon nitride ($Si_3N_4$) and an interlayer insulating film 47 made of an insulator such as silicon oxide ($SiO_2$) are stacked in this order on the top surface of the silicon substrate 10. Each silicon pillar 12 is formed perpendicularly through the interlayer insulating films 46 and 47.

The lower half part of each silicon pillar 12 is divided into two, with the center line in the word line direction therebetween. As shown in FIG. 2C, the gate electrode 18 (word line WL) of the cell transistor 11 is arranged between the divided portions. In other words, the word line WL is arranged horizontally through the silicon pillar 12 (in the word line direction). A relatively thin gate insulating film 20 is arranged between the side surfaces of the gate electrode 18 and the inner wall surfaces of the silicon pillar 12. Relatively thick insulating films 22 and 24 are arranged on the top and bottom surfaces of the gate electrode 18. The insulating films 22 and 24 are provided for the purpose of reducing GIDL (Gate Induced Drain Leakage) and GISL (Gate Induced Source Leakage), respectively.

A first impurity diffused layer 14 is arranged in a lower part of each silicon pillar 12, the first impurity diffused layer 14 constituting either one of the source and drain of the cell transistor 11. As shown in FIGS. 2A to 2C, the first impurity diffused layer 14 also diffuses into the silicon substrate 10 so as to be continuous between silicon pillars 12 that adjoin in the bit line direction. The first impurity diffused layer 14 continuous in the bit line direction constitutes a bit line BL. The first impurity diffused layer 14 is formed by diffusing an N-type (first conductivity type) impurity into silicon.

A second impurity diffused layer 16 is formed in an upper part of each silicon pillar 12, with respect to each individual silicon pillar 12. The second impurity diffused layer 16 constitutes the other of the source and drain of the cell transistor 11. The second impurity diffused layer 16 is also formed by diffusing an N-type impurity into silicon. The second impurity diffused layer 16 is formed so that its upper end protrudes slightly from the top surface of the interlayer insulating film 47. An interlayer insulating film 49 made of an insulator such as silicon nitride ($Si_3N_4$) is formed over the entire top surfaces of the second impurity diffused layers 16 and the interlayer insulating film 47 so as to cover the upper ends of the second impurity diffused layers 16.

Cell capacitors 30 having a cylindrical lower electrode 31 are formed on the top surfaces of the second impurity diffused layers 16. The lower electrodes 31 are arranged perpendicularly through the interlayer insulating film 49 and an interlayer insulting film 50 which is made of an insulating film of silicon oxide ($SiO_2$) or the like formed thereon. The bottom surfaces of the lower electrodes 31 are in contact with and electrically continuous with the corresponding second impurity diffused layers 16. The lower electrodes 31 are made of a metal film such as titanium nitride.

A thin capacitor insulating film 32 made of a high dielectric film such as hafnium oxide ($HfO_2$), zirconium oxide ($ZrO_2$), aluminum oxide ($Al_2O_3$), and their laminates is formed on the inner wall surfaces of the cylindrical lower electrodes 31. Upper electrodes 33 of the cell capacitors 30 are formed inside the capacitor insulating film 32. The upper electrodes 33 are also made of a metal film such as titanium nitride. A wiring pattern 34 is formed over the upper electrodes 33.

Figure 3:
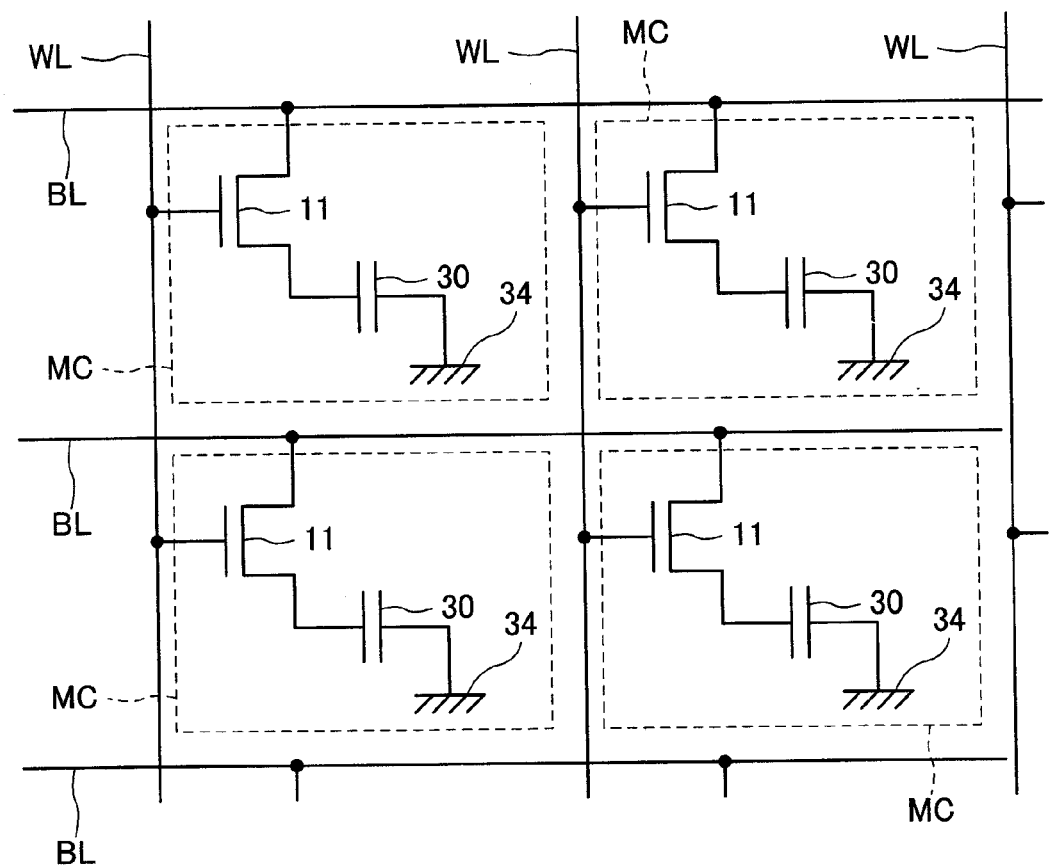
FIG. 3 is a diagram showing an equivalent circuit of the semiconductor device according to the first embodiment.

FIG. 3 is a diagram showing an equivalent circuit of the semiconductor device 1 according to the present embodiment. Note that the diagram shows an extracted circuit for only four memory cells. As shown in the diagram, in the semiconductor device 1 according to the present embodiment, a memory cell MC including a cell transistor 11 and a cell capacitor 30 is formed at each of the intersections of the word lines WL and the bit lines BL. When one of the plurality of word lines WL is activated, channels are formed in the silicon pillars 12 through which the word line WL runs, and the cell transistors 11 are turned on. Consequently, the corresponding bit lines BL and the lower electrodes 31 are electrically connected, allowing access to the cell capacitors 30 through the corresponding bit lines BL.

As has been described above, according to the semiconductor device 1 of the present embodiment, the word lines WL are formed horizontally through the silicon pillars 12. This can reduce the silicon pillars 12 in volume. Since the numbers of point defects in the silicon crystals decrease as compared to heretofore and the junction leak currents of the cell transistors become smaller, it is possible to provide a sufficient retention characteristic even if the cell capacitors have a smaller capacity.

Next, a method of manufacturing the semiconductor device 1 according to the present embodiment will be described with reference to FIGS. 4 to 31. Note that the notation FIG. X (X is a natural number) in this specification means FIGS. XA to XD in some cases. Of FIGS. 4 to 31, diagrams identified by an even-number are plan views of the semiconductor device 1. Diagrams identified by an odd-number followed by a capital letter A to D are sectional views corresponding to the cross sections taken along lines A-A, B-B, C-C, and D-D of the immediately preceding even-numbered diagrams, respectively.

Figure 4:
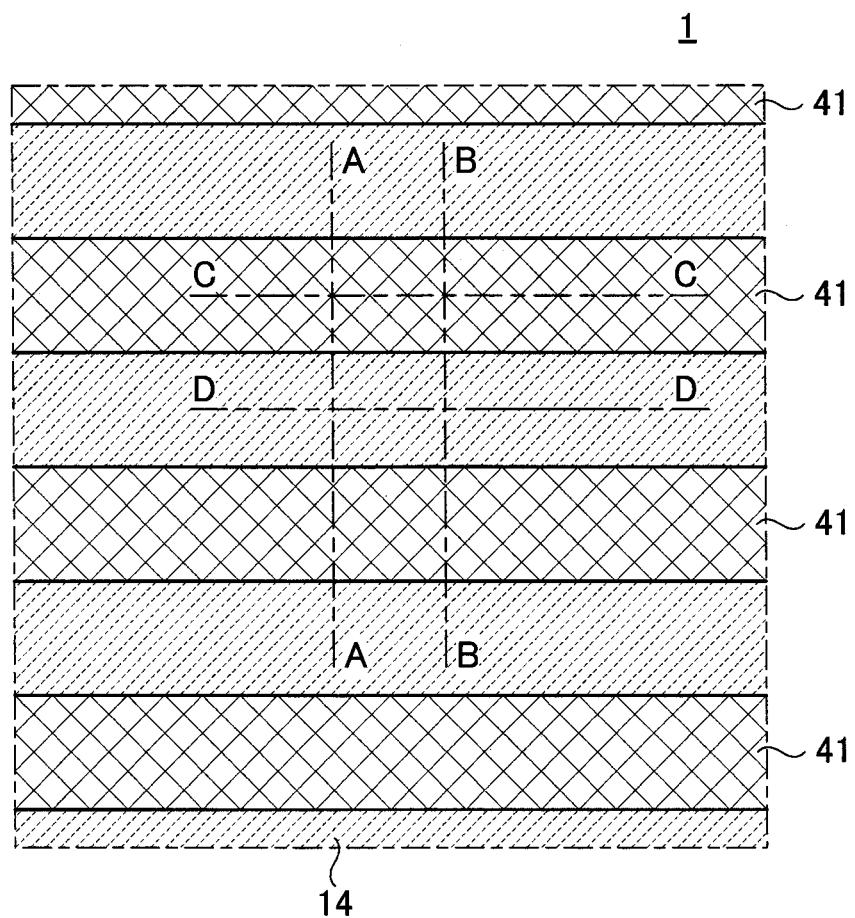
FIG. 4 is a plan view of the semiconductor device according to the first embodiment and shows a fabrication process of the semiconductor device.

Initially, as shown in FIGS. 4 and 5, a silicon substrate 10 is prepared. The top surface of the silicon substrate 10 is oxidized to form a thin silicon oxide film 40 of around 5 nm. A P-type impurity is implanted to form a PWELL (not shown). A silicon nitride film of around 60 nm is deposited, followed by field PR (Photo Resist) to form a mask pattern 41 (first mask insulating film) that extends in the bit line direction. In the present manufacturing method, the silicon pillars 12 are formed by a so-called double patterning method. More specifically, the silicon pillars 12 are formed by using two mask patterns, the mask pattern 41 extending in the bit line direction and a mask pattern 44 (to be described later) extending in the word line direction.

After the formation of the mask pattern 41, dry etching is performed into a depth of around 200 nm, thereby forming trenches 60 (third openings). With the trenches 60, there are formed silicon pillars 42 of wall shape extending in the bit line direction. Subsequently, the surface of the silicon substrate 10 including the side surfaces of the silicon pillars 42 is thermally oxidized to form a thin oxide film (not shown) of around 6 nm. An N-type impurity is then implanted into the bottoms of the trenches 60, followed by annealing to form the first impurity diffused layer 14.

Figure 6:
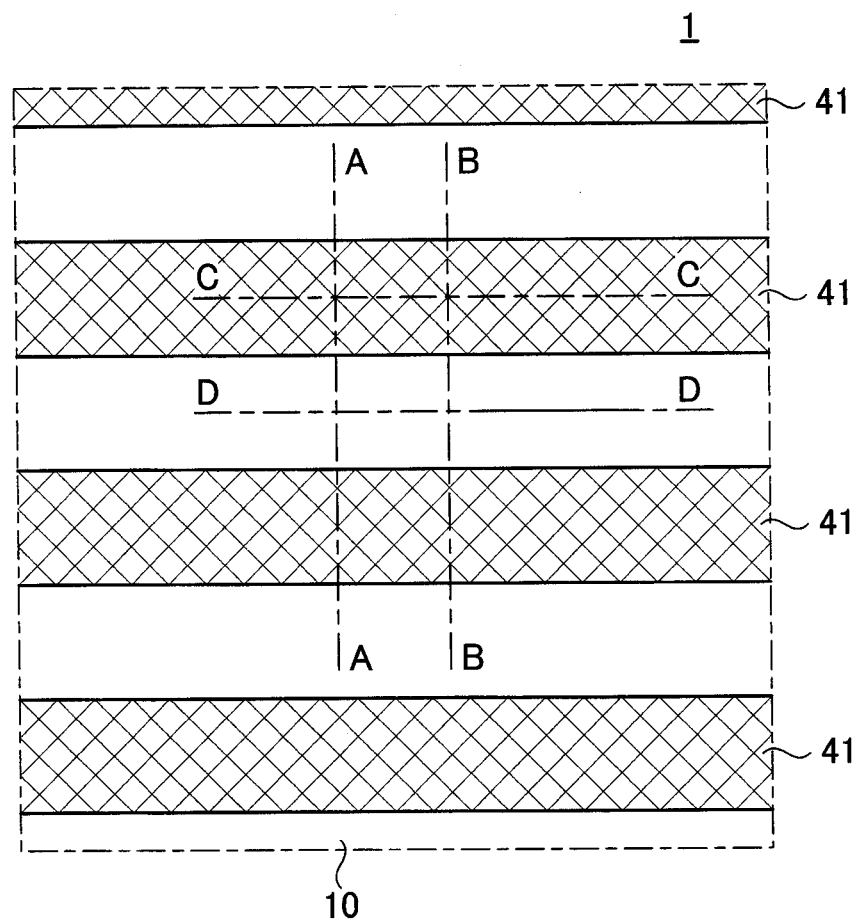
FIG. 6 is a plan view of the semiconductor device according to the first embodiment and shows a fabrication process of the semiconductor device.
Figure 7A:
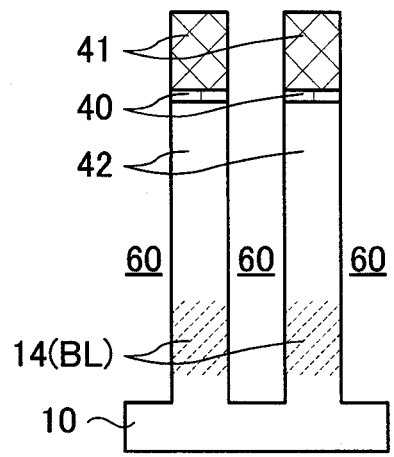
FIGS. 7A to 7D are sectional views corresponding to the cross sections taken along lines A-A, B-B, C-C, and D-D of FIG. 6, respectively.
Figure 7B:
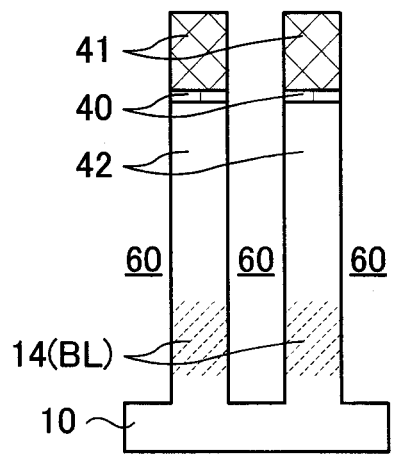
Figures 7C, 7D:
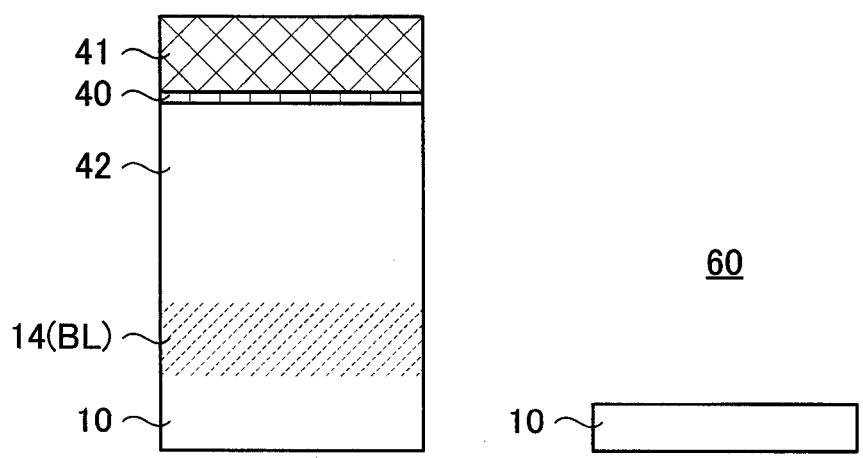

Next, as shown in FIGS. 6 and 7, the dry etching using the mask pattern 41 as the mask is performed again to deepen the trenches 60 further by 50 nm or so. This separates the first impurity diffused layer 14 into portions for the respective silicon pillars 42, thereby completing the bit lines BL.

Figure 8:
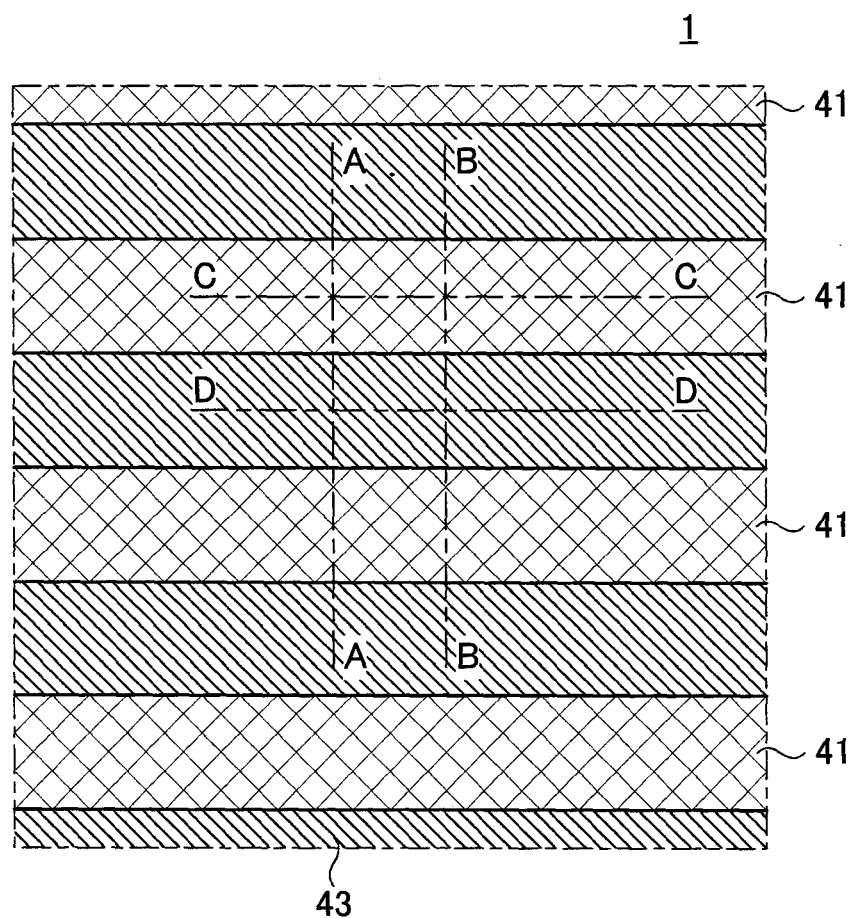
FIG. 8 is a plan view of the semiconductor device according to the first embodiment and shows a fabrication process of the semiconductor device.

Next, the entire surface is subjected to ISSG (In-Situ Steam Generation) oxidation, whereby a thin ISSG oxide film (not shown) of around 6 nm is formed over the entire surface including the surface of the mask pattern 41. Subsequently, as shown in FIGS. 8 and 9, an undoped DOPOS (Doped Poly-Si) film 43 (third insulating film) is deposited to fill the interior of the trenches 60 with the DOPOS film 43. As shown in FIGS. 9A and 9B, the etchback of the DOPOS film 43 (oxide film highly selective DOPOS dry etchback) is performed until the upper end of the mask pattern 41 protrudes. The purpose of the undoping of the DOPOS film 43 is to prevent impurities from diffusing into the silicon pillars 12 from the DOPOS film 43 when oxidizing the inner wall surfaces of the silicon pillars 12 (as will be described) to form the gate insulating film 20.

Figure 10:
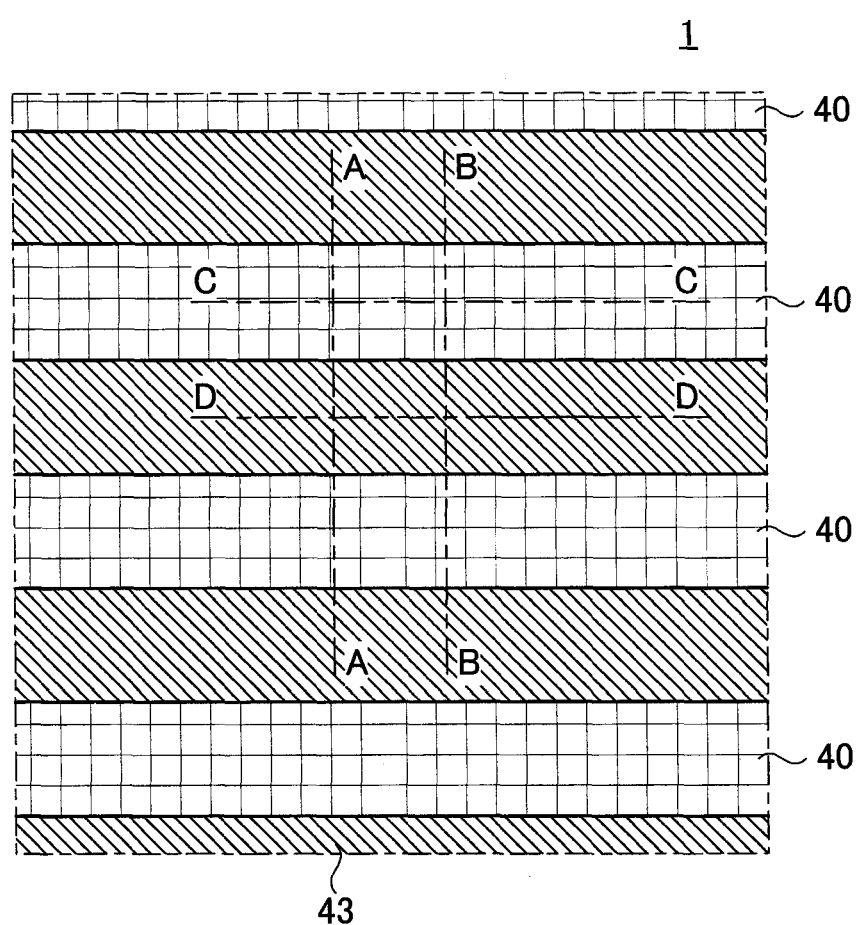
FIG. 10 is a plan view of the semiconductor device according to the first embodiment and shows a fabrication process of the semiconductor device.

Next, the DOPOS film 43 is wet etched and the mask pattern 41 is removed for surface flattening as shown in FIGS. 10 and 11.

Figure 12:
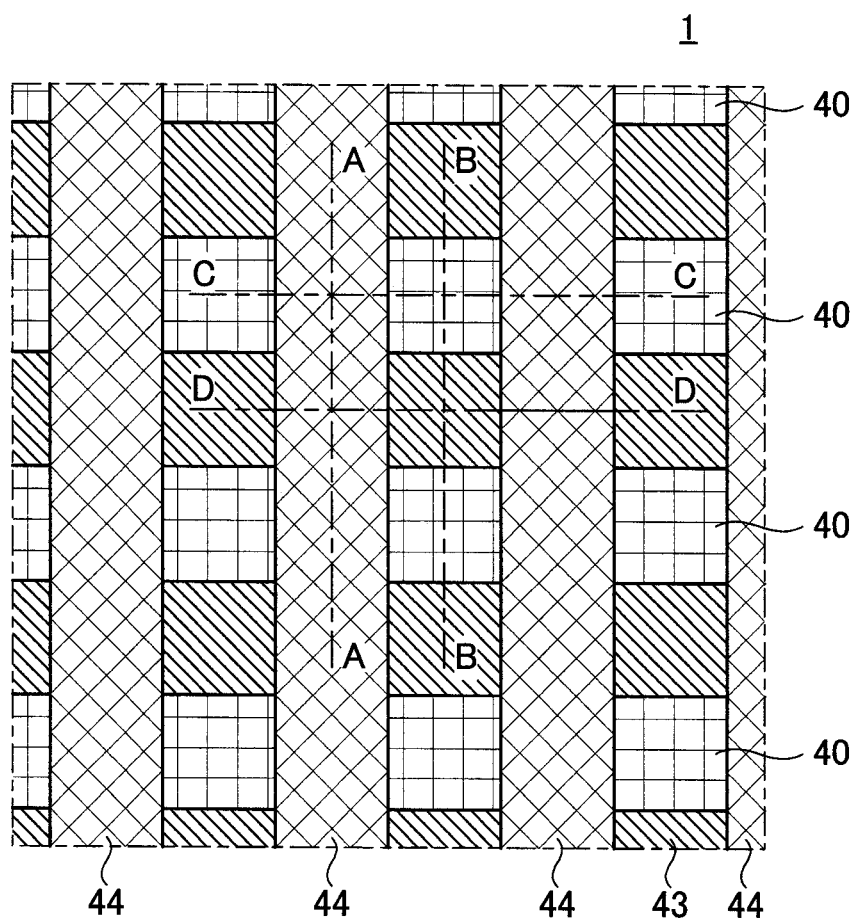
FIG. 12 is a plan view of the semiconductor device according to the first embodiment and shows a fabrication process of the semiconductor device.

Next, a silicon nitride film of around 60 nm is deposited on the flattened surface, followed by field PR (Photo Resist) to form a mask pattern 44 (second mask insulating film) that extends in the word line direction as shown in FIGS. 12 and 13.

Figure 14:
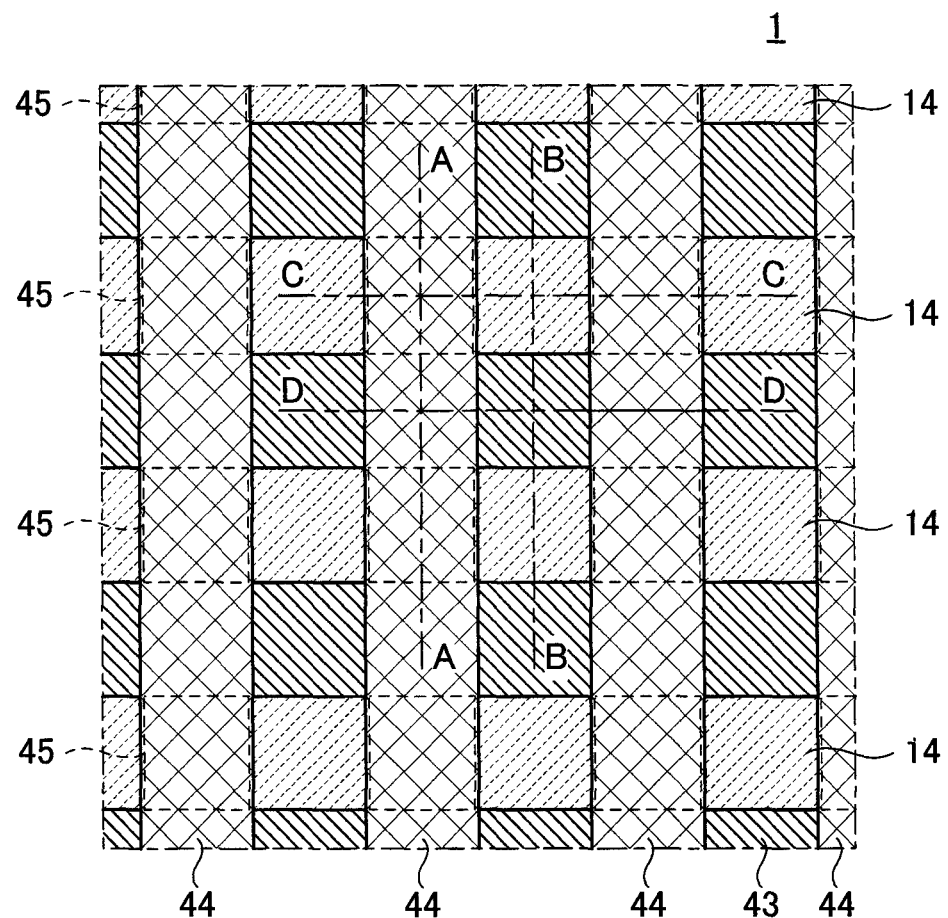
FIG. 14 is a plan view of the semiconductor device according to the first embodiment and shows a fabrication process of the semiconductor device.
Figures 15A, 15B:
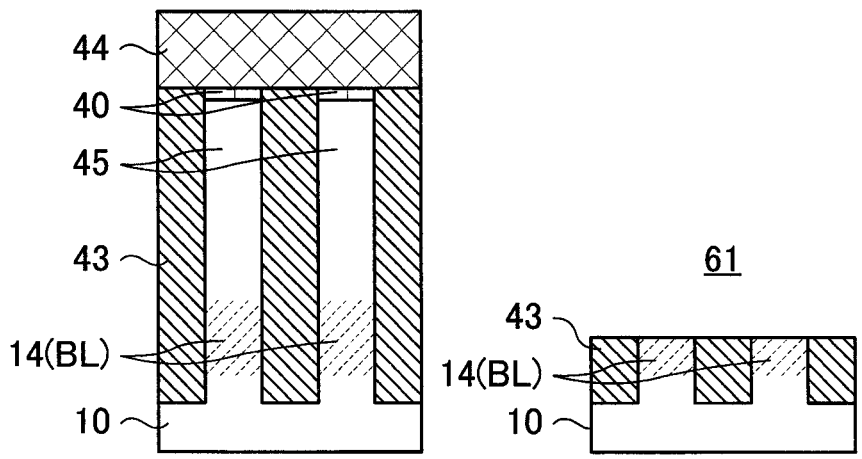
FIGS. 15A to 15D are sectional views corresponding to the cross sections taken along lines A-A, B-B, C-C, and D-D of FIG. 14, respectively.
Figures 15C, 15D:
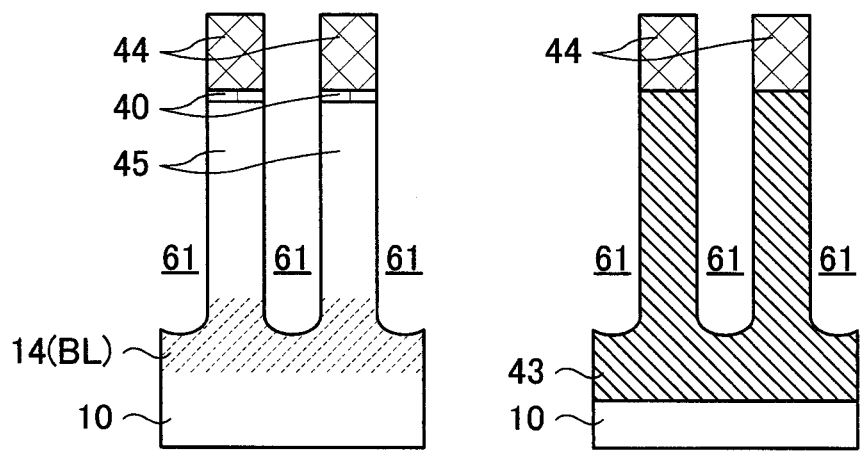

After the formation of the mask pattern 44, the silicon and the silicon oxide film are simultaneously etched into a depth such that the top surface of the first impurity diffused layer 14 is exposed and the first impurity diffused layer 14 is not pierced through, thereby forming trenches 61. By the processing so far, as shown in FIGS. 14 and 15, silicon pillars 45 are formed at the respective intersections of the word lines WL and the bit lines BL.

Figure 16:
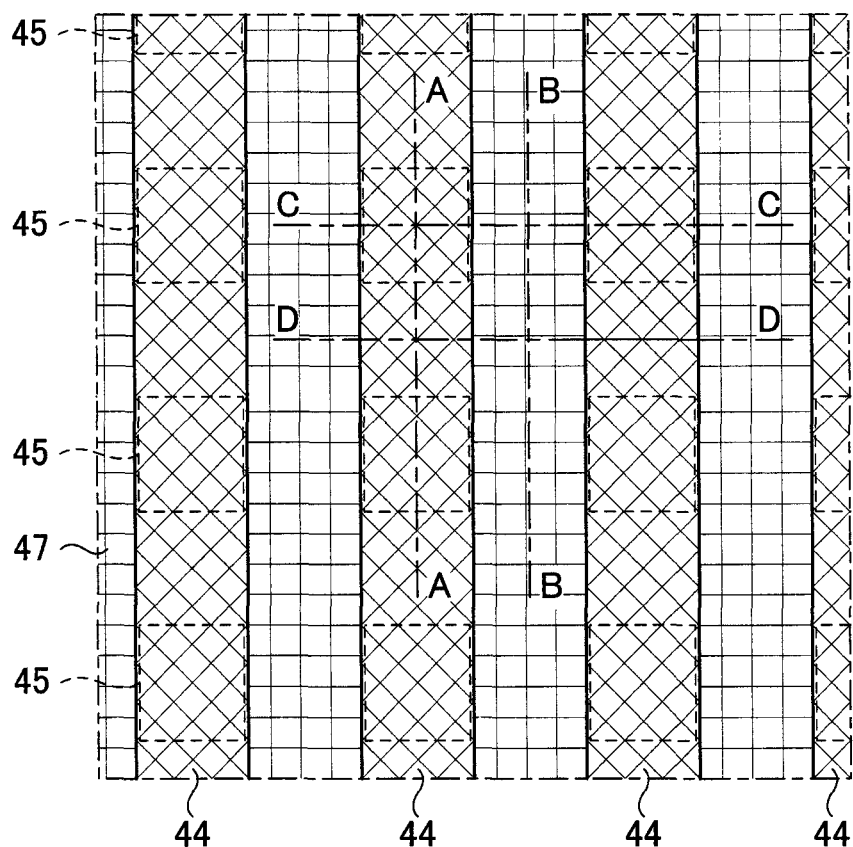
FIG. 16 is a plan view of the semiconductor device according to the first embodiment and shows a fabrication process of the semiconductor device.

Next, as shown in FIGS. 16 and 17, an insulating film (first insulating film) is deposited so as to fill the periphery of the silicon pillars 45 and the mask pattern 44. Specifically, the surface of the silicon substrate 10 including the side surfaces of the silicon pillars 45 is thermally oxidized to form a thin oxide film (not shown) of around 8 nm. A silicon nitride film 46 is further deposited, followed by wet etchback or dry etchback. A silicon oxide film 47 is deposited further. CMP (Chemical Mechanical Polishing) is performed for surface flattening until the surface of the mask pattern 44 is exposed.

Figure 18:
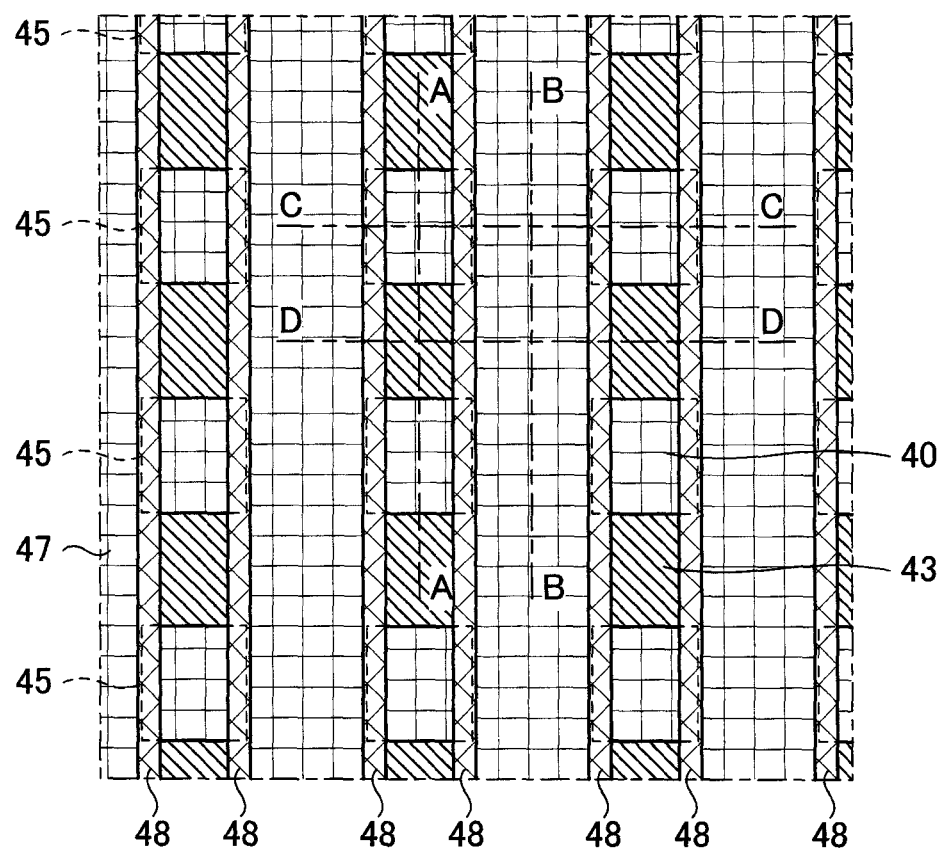
FIG. 18 is a plan view of the semiconductor device according to the first embodiment and shows a fabrication process of the semiconductor device.

Next, the mask pattern 44 is removed with hot phosphoric acid. A thin silicon nitride film is deposited, followed by etchback. Consequently, as shown in FIGS. 18 and 19, a sidewall nitride film 48 having a thickness of around 7 nm is formed in openings 62 (first openings) that are formed by the removal of the mask pattern 44.

Figure 20:
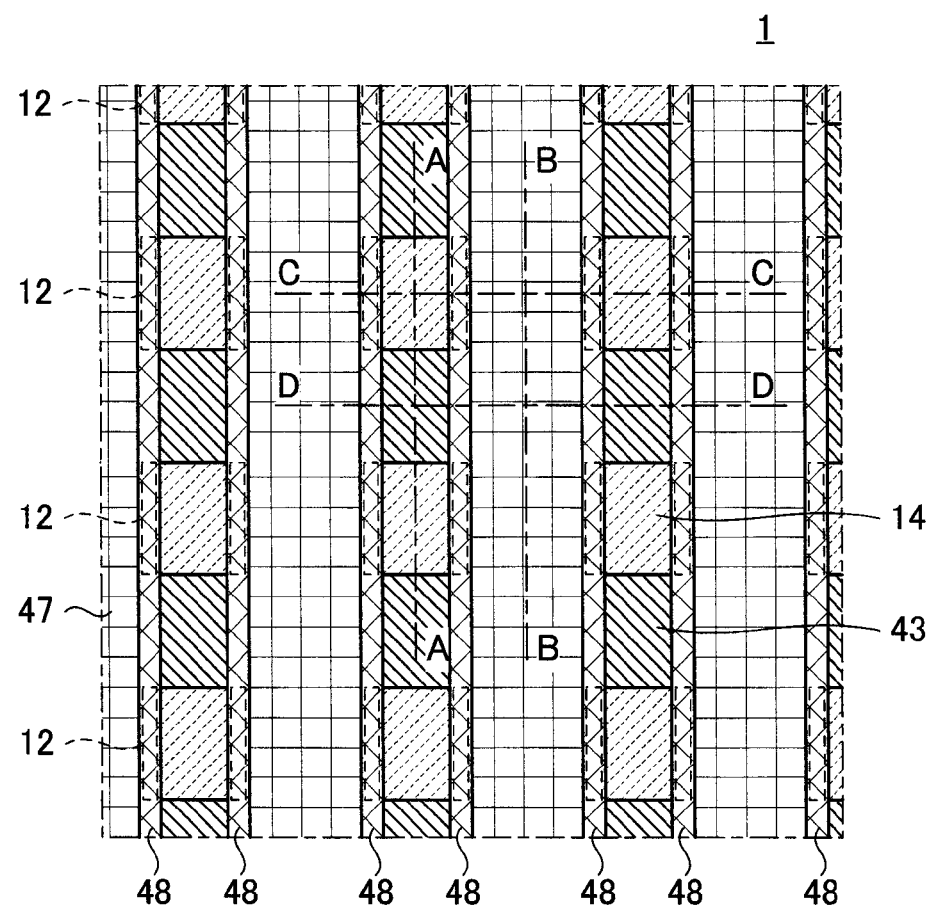
FIG. 20 is a plan view of the semiconductor device according to the first embodiment and shows a fabrication process of the semiconductor device.
Figure 21A:
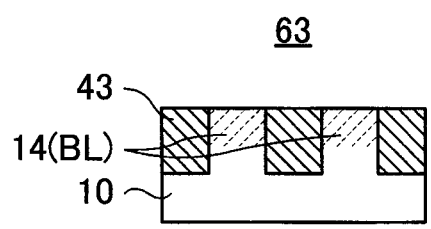
Figure 21B:
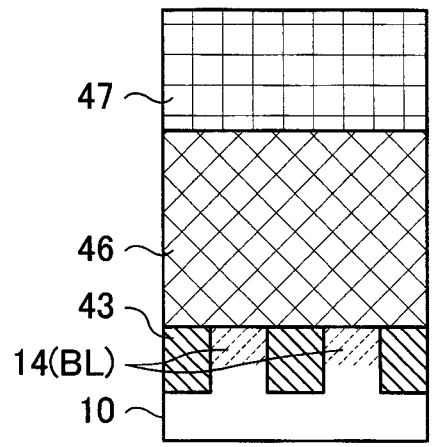
Figure 21C:
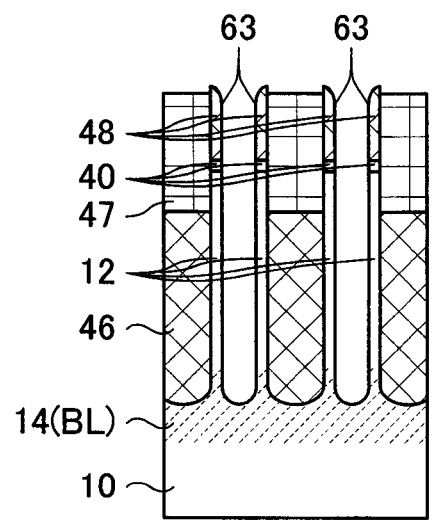
Figure 21D:
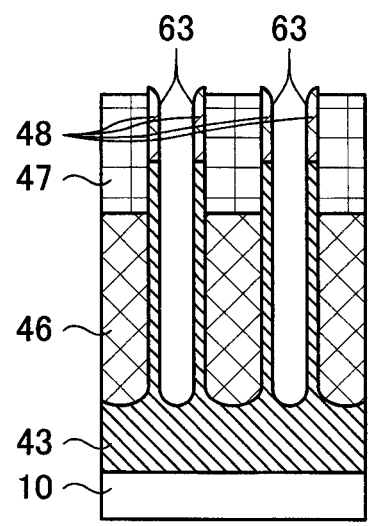

Next, using the sidewall nitride film 48 and the silicon oxide film 47 as a mask, the silicon pillars 45 and the DOPOS film 43 are etched to form trenches 63 (second openings) horizontally through the silicon pillars 45 as shown in FIGS. 20 and 21. This forms part of the silicon pillars 12 that are each divided into two with the center line in the word line direction therebetween (the portions other than the upper end parts). It should be noted that the etching also etches the silicon oxide film 47, whereas the etching selectivity and the thickness of the silicon oxide film 47 are appropriately adjusted so that the silicon oxide film 47 having a sufficient thickness for an interlayer insulating film is left after the etching.

Figure 22:
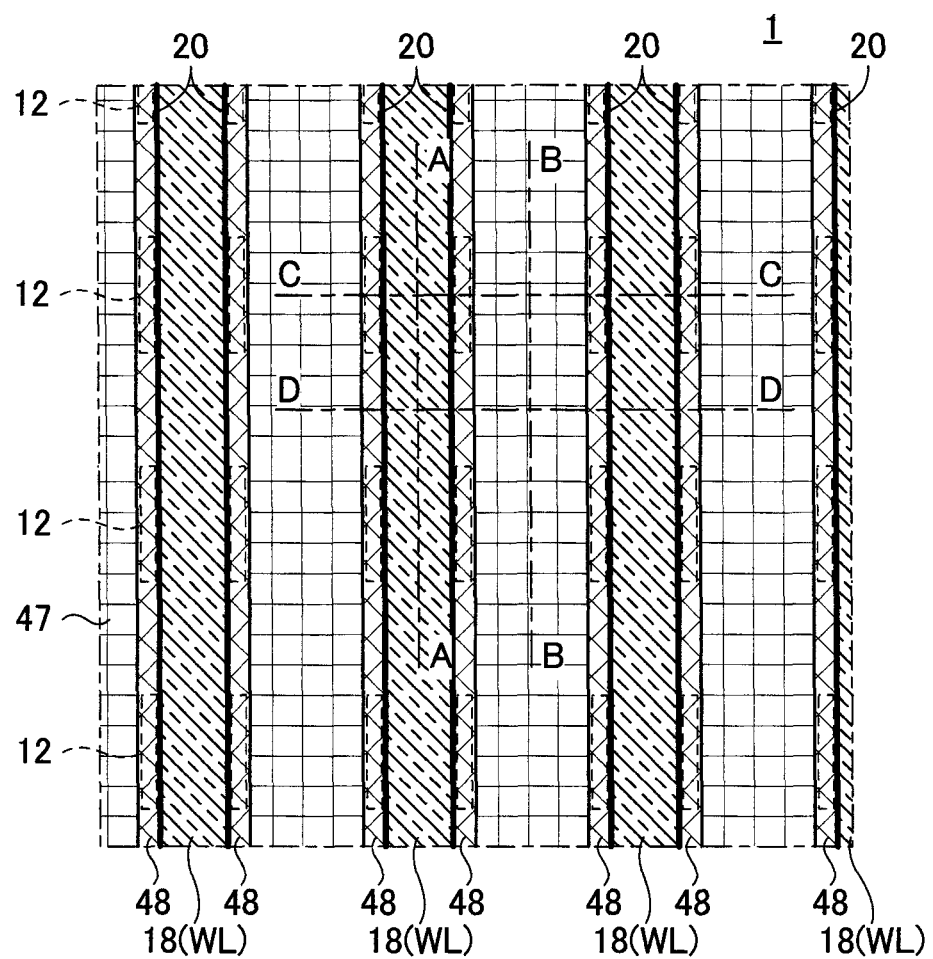

Next, the inner walls of the trenches 63 are oxidized (gate oxidation) to form the gate insulating film 20 shown in FIGS. 22 and 23. Subsequently, deposition and etchback of a silicon nitride film and deposition and etchback of a DOPOS film are performed in succession. Consequently, as shown in FIGS. 22 and 23, the gate electrodes 18 (word lines WL) which run horizontally through the silicon pillars 12 and the insulating film 24 which is intended to insulate the bottom surfaces of the gate electrodes 18 from the silicon substrate 10 and the silicon pillars 12 are formed in the trenches 63.

Figure 24:
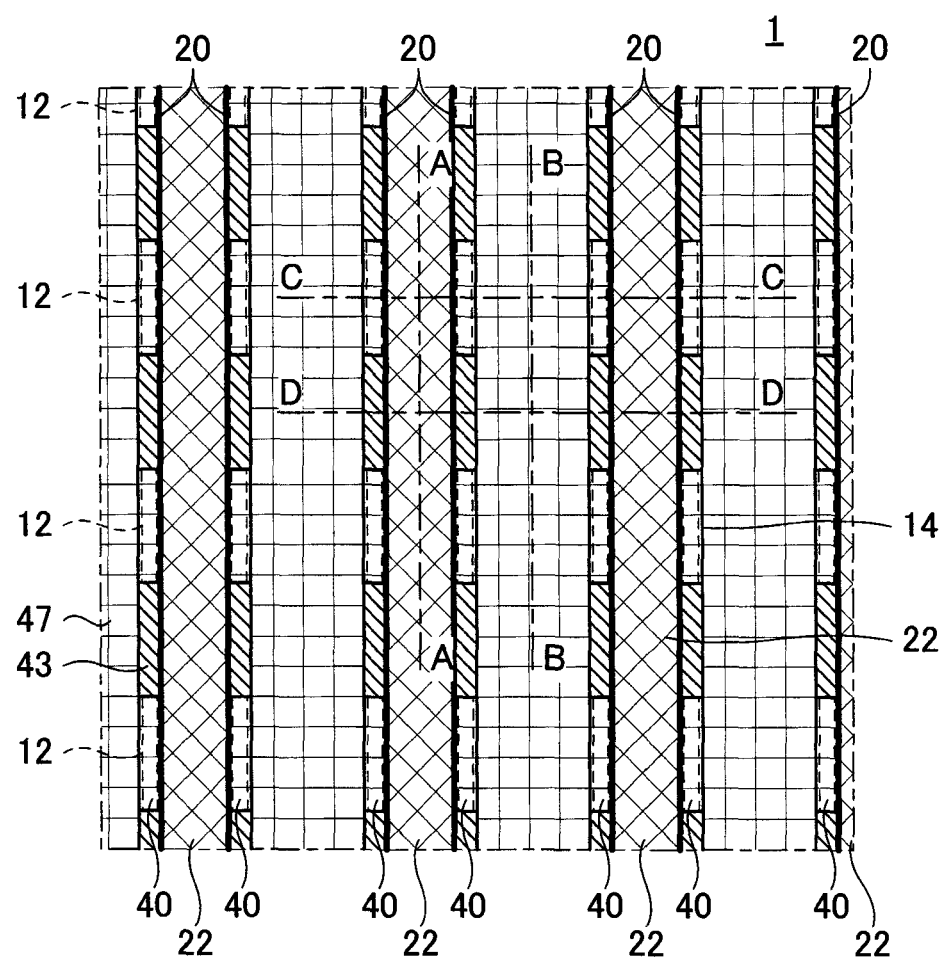
FIG. 24 is a plan view of the semiconductor device according to the first embodiment and shows a fabrication process of the semiconductor device.

A silicon nitride film is further deposited, followed by etchback with hot phosphoric acid. As shown in FIGS. 24 and 25, the insulating film 22 for insulating the top surfaces of the gate electrodes 18 from the silicon pillars 12 is thereby formed and the sidewall nitride film 48 is removed.

Figure 26:
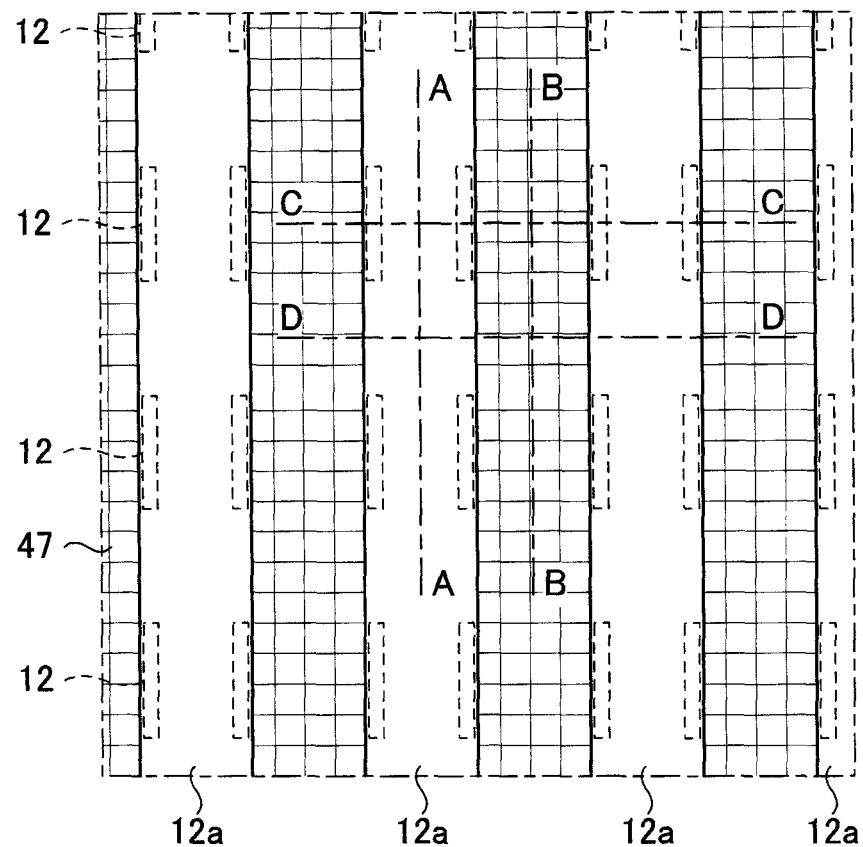
FIG. 26 is a plan view of the semiconductor device according to the first embodiment and shows a fabrication process of the semiconductor device.
Figure 28:
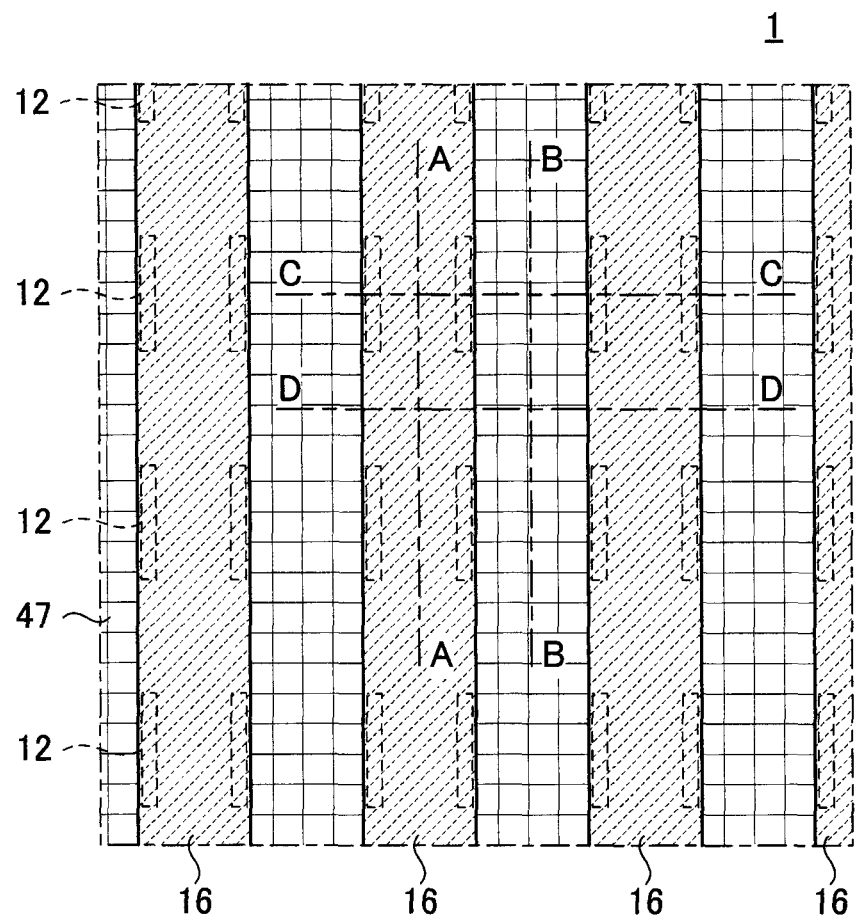
FIG. 28 is a plan view of the semiconductor device according to the first embodiment and shows a fabrication process of the semiconductor device.

Next, the silicon oxide film 40 and the exposed portions of the gate insulating film 20 are removed. The silicon pillars 12 are then extended upward to form upper end parts 12a as shown in FIGS. 26 and 27. Specifically, the portions of the silicon pillars 12 exposed on the inner walls of the trenches 63 are utilized for selective epitaxial growth of single crystal silicon. An N-type impurity is then implanted, followed by annealing. As shown in FIGS. 28 and 29, the second impurity diffused layers 16 are thereby formed in the upper end parts 12a.

Figure 30:
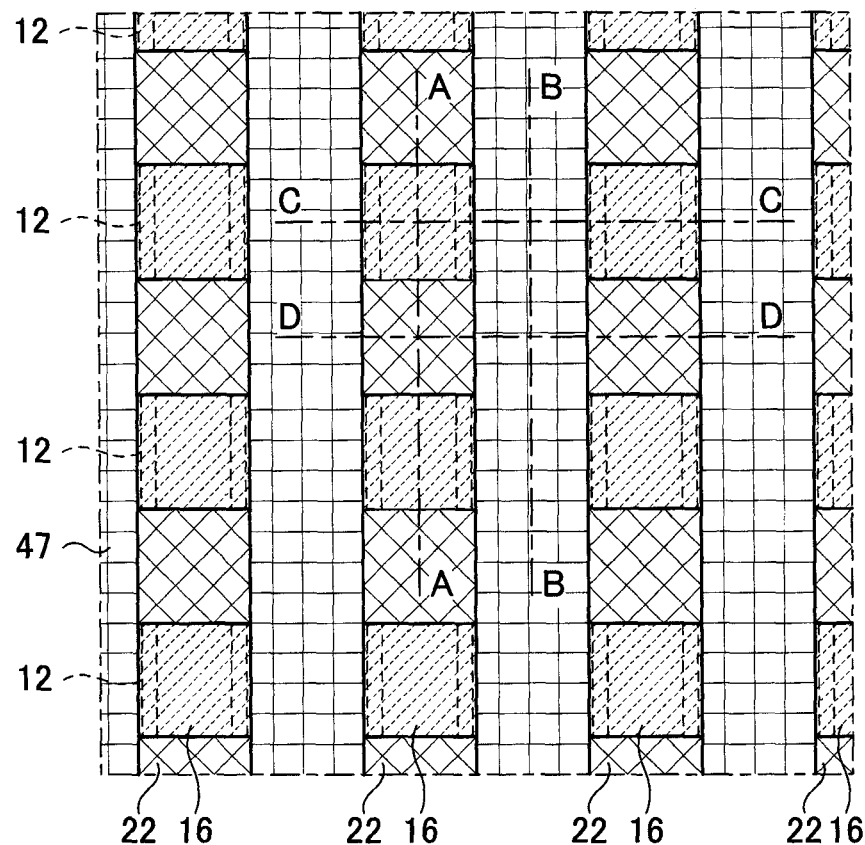
FIG. 30 is a plan view of the semiconductor device according to the first embodiment and shows a fabrication process of the semiconductor device.

After the formation of the second impurity diffused layers 16, the same mask pattern (not shown) as the foregoing mask pattern 41 is formed to perform dry etching of the silicon. Consequently, as shown in FIGS. 30 and 31, the second impurity diffused layers 16 are separated for the respective silicon pillars 12. By the foregoing processing, the cell transistors 11 shown in FIGS. 1 to 3 are completed.

Subsequently, as shown in FIG. 2, the interlayer insulating films 49 and 50 are deposited, the capacitors 30 are formed, and the wiring pattern 34 is formed to complete the semiconductor device 1.

As has been described above, according to the present manufacturing method, the semiconductor device 1 having capacitors in its memory cells can be provided with the word lines WL that run horizontally through the silicon pillars 12. Since the upper end parts 12a of the silicon pillars 12 are formed by using selective epitaxial growth, it is possible to suppress a rise in the contact resistance.

Figure 32:
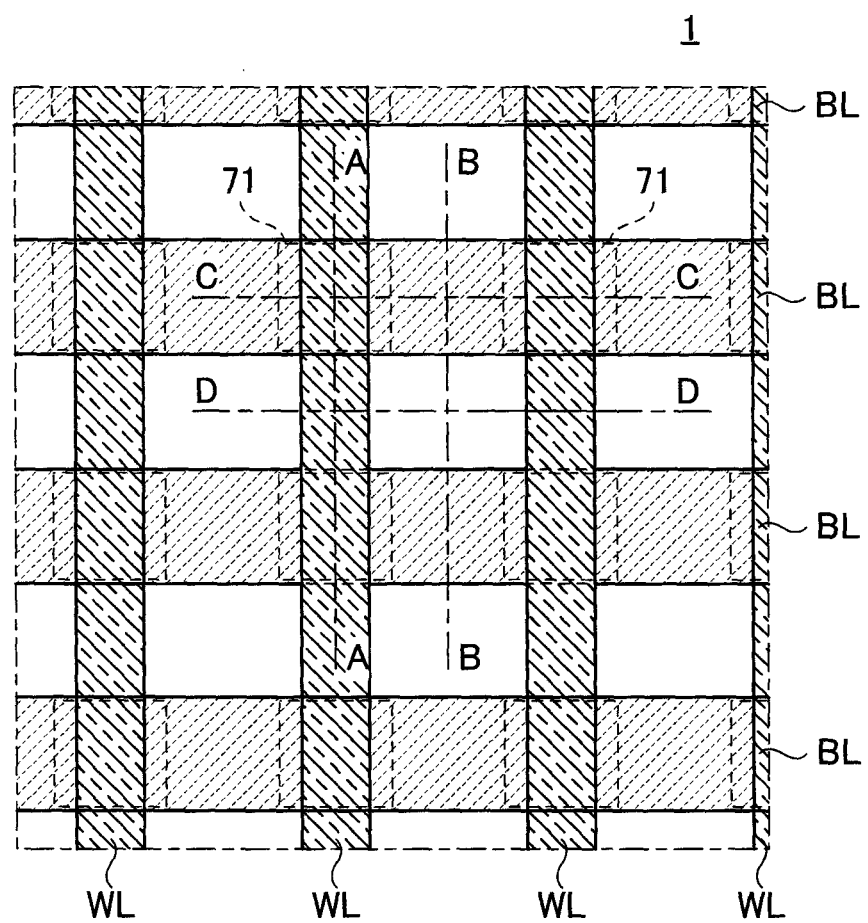
FIG. 32 is a plan view of a semiconductor device according to a second embodiment of the present invention.

FIG. 32 is a plan view of a semiconductor device 1 according to a second embodiment of the present invention. Note that the diagram also shows the positions of word lines WL and bit lines BL which do not actually appear in the surface. FIGS. 33A to 33D are sectional views corresponding to the cross sections taken along lines A-A, B-B, C-C, and D-D of FIG. 32, respectively.

The semiconductor device 1 according to the present embodiment is a semiconductor memory device (DRAM) that uses no memory cell capacitors, i.e., of so-called capacitorless type. The semiconductor device 1 is formed in and over a P-type area PWELL (not shown) which is formed in the surface of a silicon substrate 10.

The layout of the word lines WL and the bit lines BL is the same as in the semiconductor device 1 according to the first embodiment. Thyristors 71, not cell transistors, are arranged at the intersections of the word lines WL and the bit lines BL. Like the cell transistors described in the first embodiment, the thyristors 71 include silicon pillars 12 which are formed generally perpendicularly to the main surface of the silicon substrate 10. The silicon pillars 12 are arranged perpendicularly through the interlayer insulating films 46 and 47 as in the first embodiment.

Figure 33A:
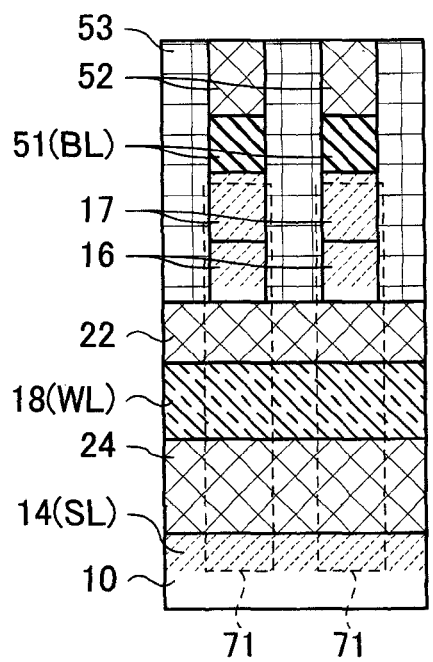
FIGS. 33A to 33D are sectional views corresponding to the cross sections taken along lines A-A, B-B, C-C, and D-D of FIG. 32, respectively.
Figure 33B:
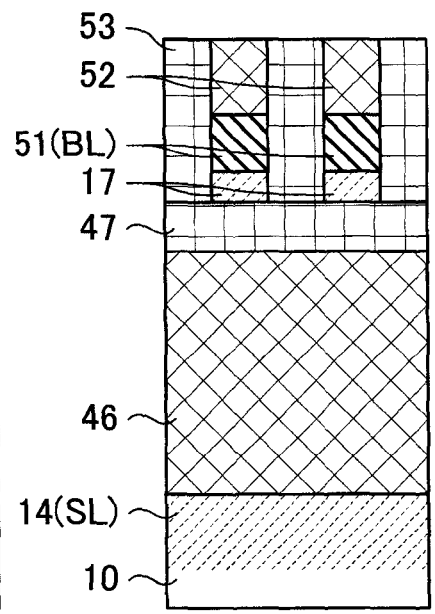
Figure 33C:
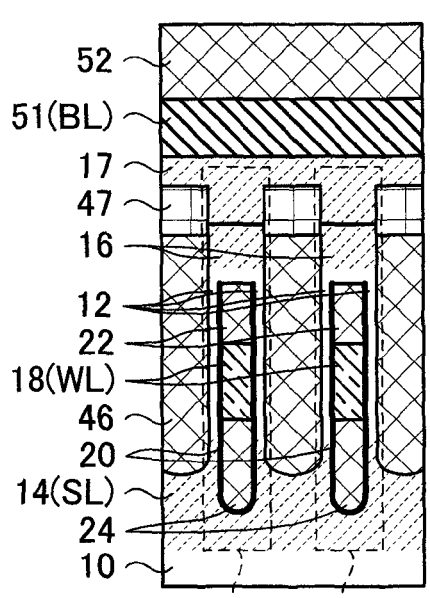

The thyristor 71 is a quadruple structure device of NPNP type in which two N-type impurity diffused layers and two P-type impurity diffused layers are alternately stacked in order from the bottom of the silicon pillar 12. Referring to FIG. 33C, the correspondence between the four layers and those appearing in the drawings will be described. The first impurity diffused layer 14 arranged in a lower part of each silicon pillar 12 corresponds to the lowest N-type impurity diffused layer. The internal area (PWELL) of the silicon pillar 12 lying above the N-type impurity diffused layer 14 corresponds to the second lowest P-type impurity diffused layer. The second impurity diffused layer 16 lying above corresponds to the third lowest N-type impurity diffused layer. The third impurity diffused layer 17 arranged in contact with the upper end of the second impurity diffused layer 16 corresponds to the highest P-type impurity diffused layer.

The first impurity diffused layer 14 corresponding to the lowest N-type impurity diffused layer is formed by diffusing an N-type impurity into silicon. As shown in FIGS. 33A to 33D, the first impurity diffused layer 14 also diffuses into the silicon substrate 10 so as to be continuous between adjoining silicon pillars 12. As a result, the source line SL is commonly connected to all the thyristors 71.

The internal area of the silicon pillar 12 corresponding to the second lowest P-type impurity diffused layer is divided into two with the center line in the word line direction therebetween as in the first embodiment. As shown in FIG. 33(c), the gate electrode 18 (word line WL) is arranged between the divided portions. Other similarities to the first embodiment are that a relatively thin gate insulating film 20 is arranged between the side surfaces of the gate electrode 18 and the inner wall surfaces of the silicon pillar 12, and that relatively thick insulating films 22 and 24 are arranged on the top and bottom surfaces of the gate electrode 18.

The second impurity diffused layer 16 corresponding to the third lowest N-type impurity diffused layer is formed by diffusing an N-type impurity into silicon. The second impurity diffused layer 16 is independently formed for each individual silicon pillar 12.

The third impurity diffused layer 17 corresponding to the highest P-type impurity diffused layer is formed by diffusing a P-type impurity into silicon. As shown in FIGS. 33A to 33C, the third impurity diffused layer 17 is continuous between silicon pillars 12 that adjoin in the bit line direction. The bit lines BL are made of a layered film 51 (WN/W film) of tungsten nitride (WN) and tungsten (W), which is formed in contact with the upper ends of the third impurity diffused layers 17. A silicon nitride film 52 is further formed on the bit lines BL.

Figure 33D:
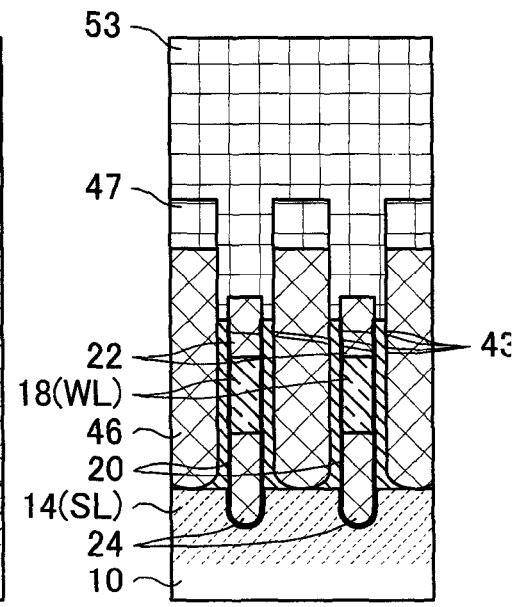

As shown in FIGS. 33A, 33B, and 33D, the second impurity diffused layer 16, the third impurity diffused layer 17, the layered film 51 (bit lines BL), and the silicon nitride film are formed perpendicularly through the interlayer insulating film 53 which is made of an insulating film such as silicon oxide ($SiO_2$). The interlayer insulating film 53 plays the role of electrically separating such layers (films) between thyristors 71 that adjoin in the word line direction.

Figure 34:
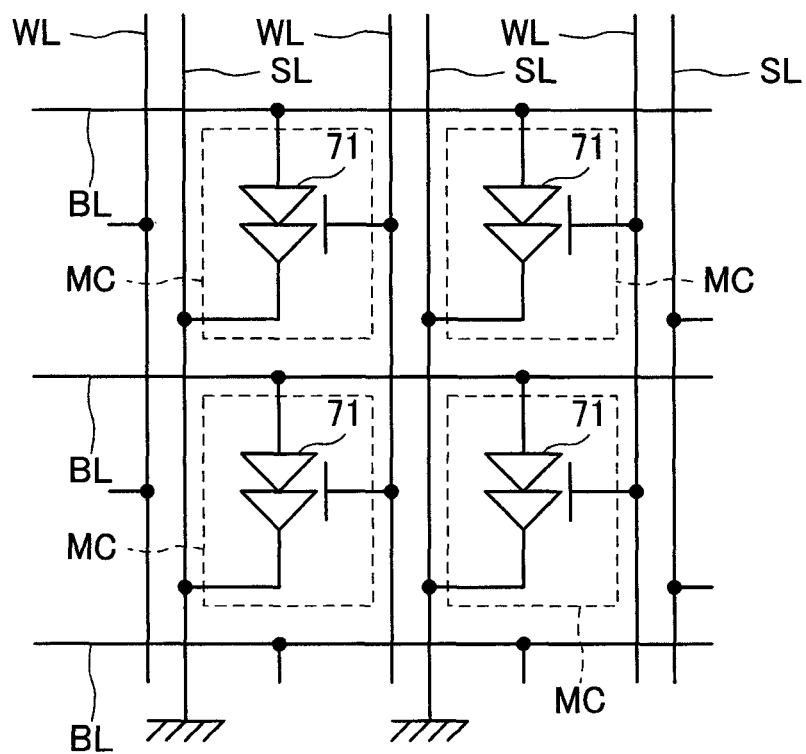
FIG. 34 is a diagram showing an equivalent circuit of the semiconductor device according to the second embodiment.

FIG. 34 is a diagram showing an equivalent circuit of the semiconductor device 1 according to the present embodiment. Note that the diagram shows an extracted circuit for only four memory cells. As shown in the diagram, in the semiconductor device 1 according to the present embodiment, a memory cell including a thyristor 71 is formed at each of the intersections of the word lines WL and the bit lines BL. The source lines SL are grounded. According to such configuration, it is possible to store an electric charge into the second lowest P-type impurity diffused layer (the midsection of the silicon pillar 12) of the thyristor 71 in a certain memory cell or read the amount of the charge stored therein, depending on a combination of voltages applied to the word lines WL and bit lines BL. That is, it is possible to perform a write and read to/from the thyristors 71.

As has been described above, even in the semiconductor device 1 of the present embodiment, the word lines WL are formed horizontally through the silicon pillars 12. This makes it possible to reduce the silicon pillars 12 in volume. Since the numbers of point defects in the silicon crystals decrease as compared to heretofore and the junction leak currents of the thyristors become smaller, it is possible to provide a sufficient retention characteristic even if the thyristors can only store a small amount of charge.

Now, a method of manufacturing the semiconductor device 1 according to the present embodiment will be described with reference to FIGS. 35 to 62. Of FIGS. 35 to 62, diagrams identified by an odd-number are plan views of the semiconductor device 1. Diagrams identified by an even-number followed by a capital letter A to D are sectional views corresponding to the cross sections taken along lines A-A, B-B, C-C, and D-D of the immediately preceding odd-numbered diagrams, respectively.

Figure 35:
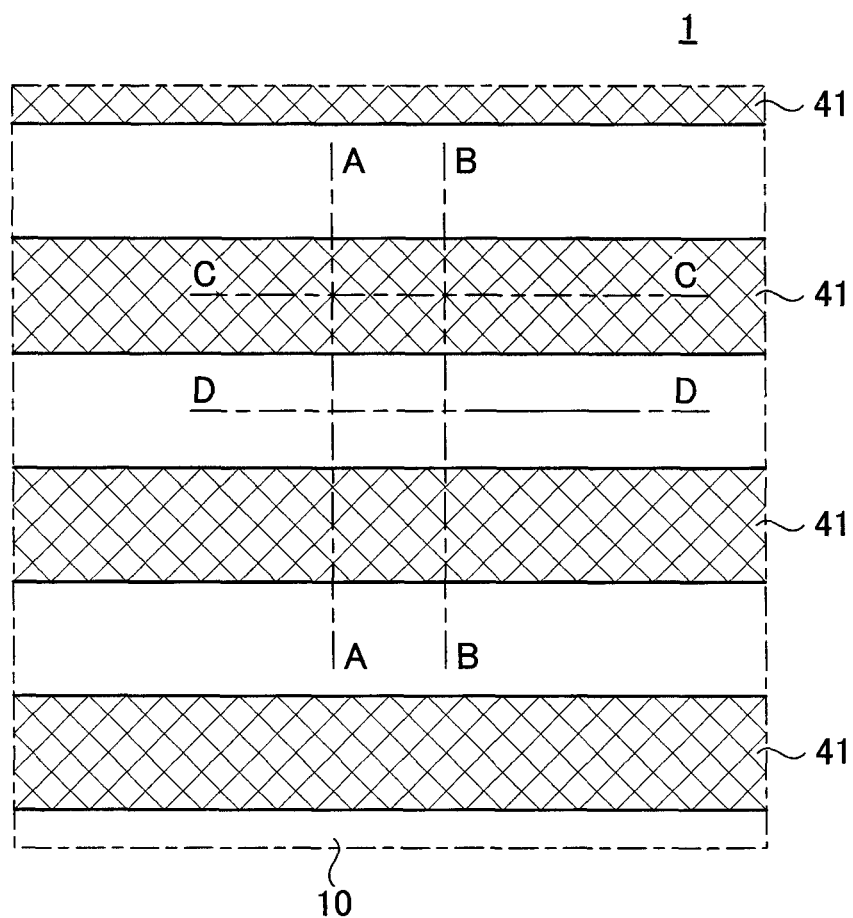
FIG. 35 is a plan view of the semiconductor device according to the second embodiment and shows a fabrication process of the semiconductor device.

Initially, as shown in FIGS. 35 and 36, a silicon substrate 10 is prepared. The top surface of the silicon substrate 10 is oxidized to form a thin silicon oxide film 40 of around 5 nm, and a P-type impurity is implanted to form a PWELL (not shown). A silicon nitride film of around 60 nm is then deposited, followed by field PR (Photo Resist) to form a mask pattern 41 (first mask insulating film) that extends in the bit line direction. Again, in the present manufacturing method, the silicon pillars 12 are formed by a so-called double patterning method.

After the formation of the mask pattern 41, dry etching is performed into a depth of around 250 nm, thereby forming trenches 60 (third openings). With the trenches 60, there are formed silicon pillars 42 of wall shape extending in the bit line direction.

Figure 37:
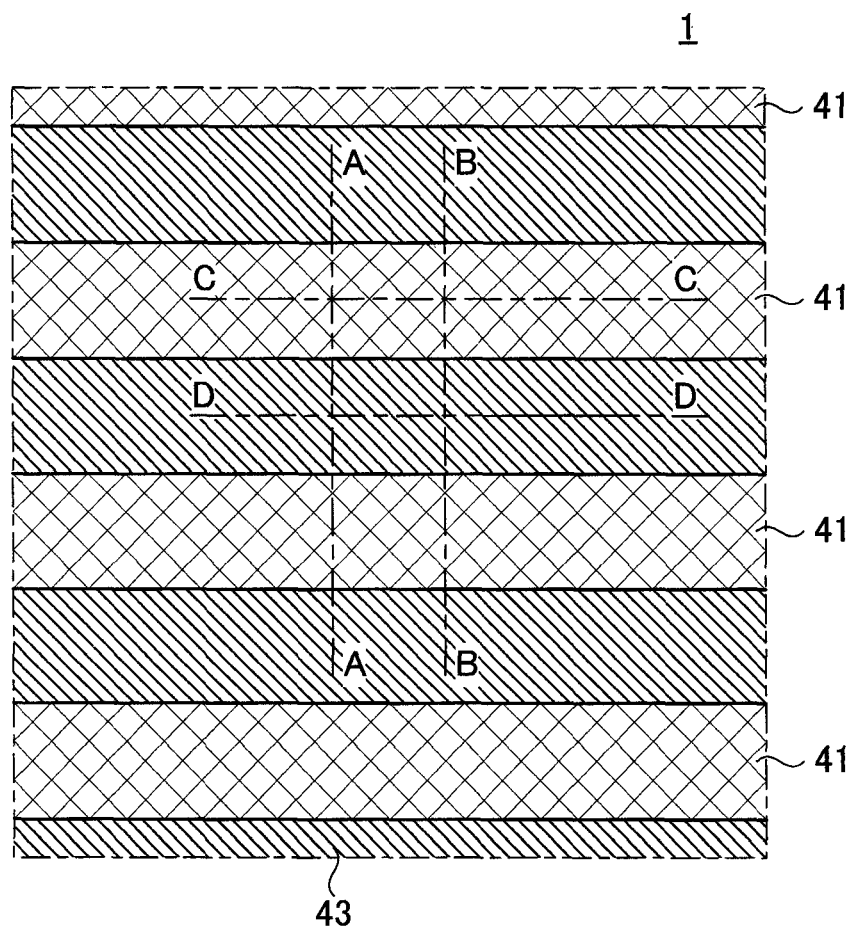
FIG. 37 is a plan view of the semiconductor device according to the second embodiment and shows a fabrication process of the semiconductor device.

Next, the entire surface is subjected to ISSG (In-Situ Steam Generation) oxidation, whereby a thin ISSG oxide film (not shown) of around 6 nm is formed over the entire surface including the surface of the mask pattern 41. Subsequently, as shown in FIGS. 37 and 38, an undoped DOPOS (Doped Poly-Si) film 43 (third insulating film) is deposited to fill the interior of the trenches 60 with the DOPOS film 43. As shown in FIGS. 38A and 38B, the etchback of the DOPOS film 43 (oxide film highly selective poly-Si dry etchback) is performed until the upper end of the mask pattern 41 protrudes. The purpose of the undoping of the DOPOS film 43 is to prevent impurities from diffusing into the silicon pillars 12 from the DOPOS film 43 when oxidizing the inner wall surfaces of the silicon pillars 12 (as will be described) to form the gate insulating film 20. The undoping is also intended to facilitate subsequent etching (etching for forming trenches 61 to be described later).

Figure 39:
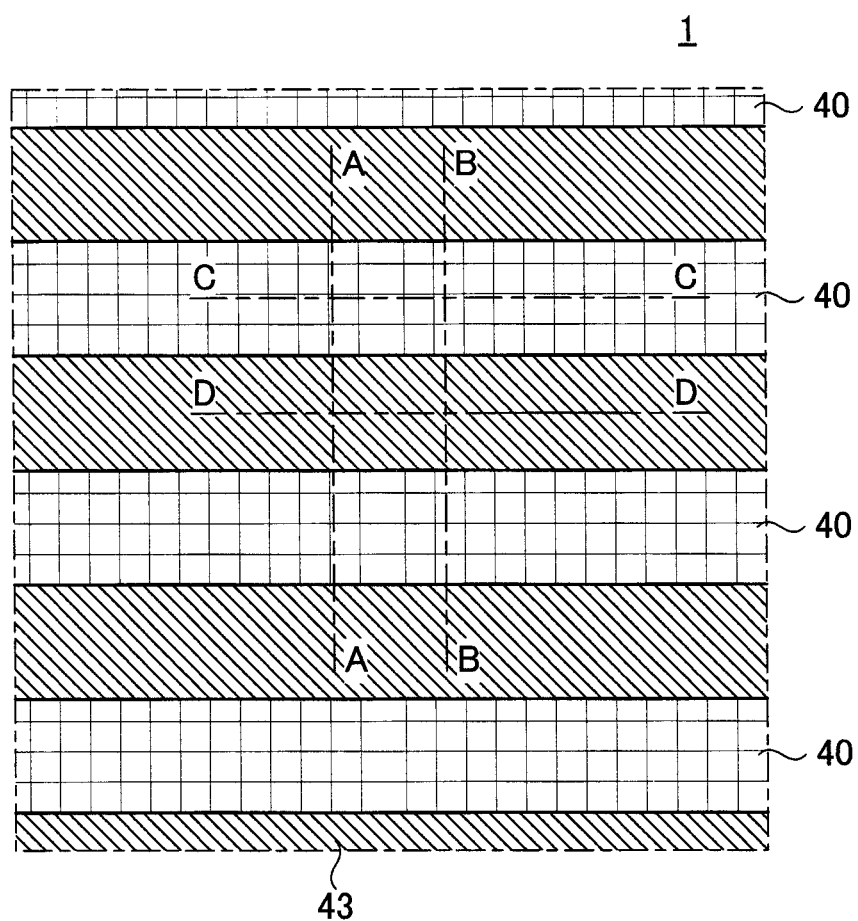
FIG. 39 is a plan view of the semiconductor device according to the second embodiment and shows a fabrication process of the semiconductor device.

Next, the DOPOS film 43 is wet etched and the mask pattern 41 is removed for surface flattening as shown in FIGS. 39 and 40.

Figure 41:
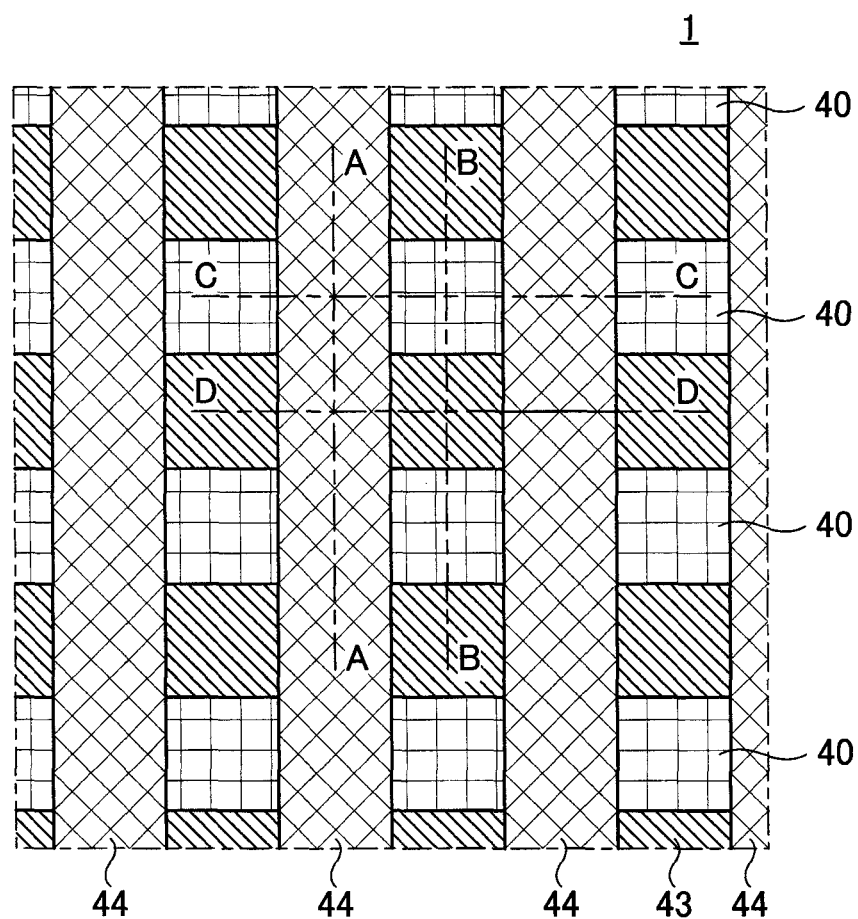
FIG. 41 is a plan view of the semiconductor device according to the second embodiment and shows a fabrication process of the semiconductor device.

Next, a silicon nitride film of around 60 nm is deposited on the flattened surface, followed by field PR (Photo Resist) to form a mask pattern 44 (second mask insulating film) that extends in the word line direction as shown in FIGS. 41 and 42.

Figure 43:
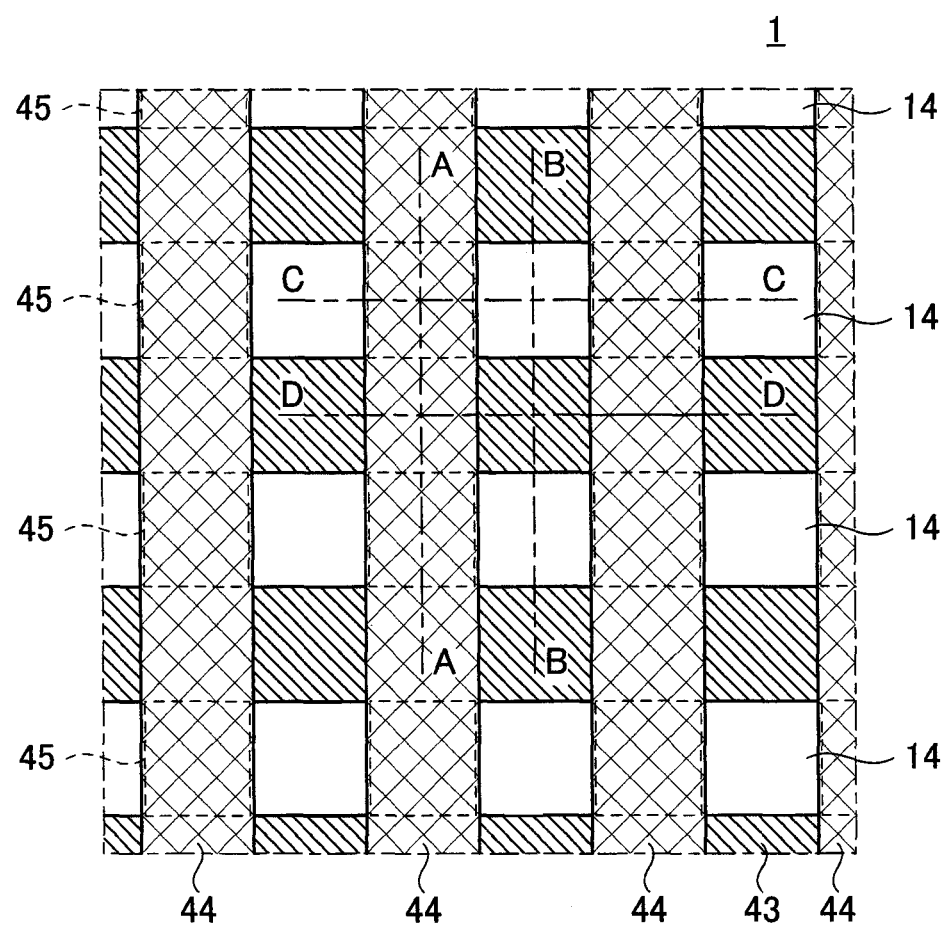
FIG. 43 is a plan view of the semiconductor device according to the second embodiment and shows a fabrication process of the semiconductor device.

After the formation of the mask pattern 44, the silicon and the silicon oxide film are simultaneously etched to form trenches 61. By the processing so far, as shown in FIGS. 43 and 44, silicon pillars 45 are formed at the respective intersections of the word lines WL and the bit lines BL.

Figure 45:
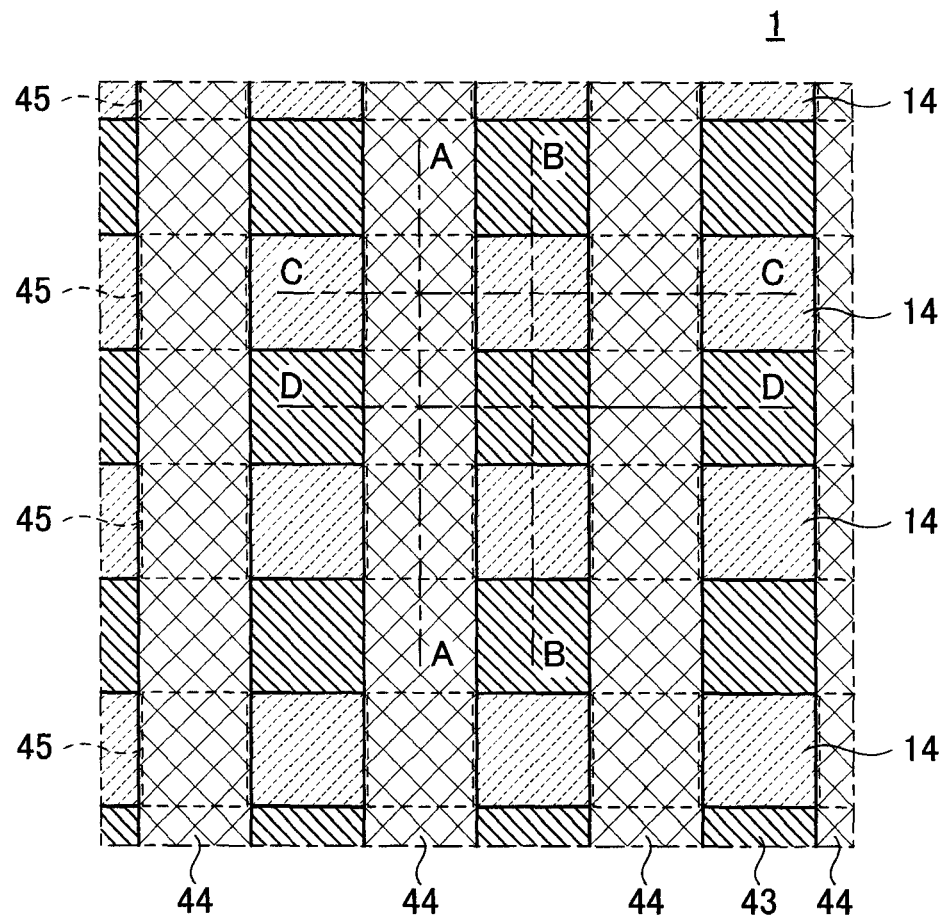
FIG. 45 is a plan view of the semiconductor device according to the second embodiment and shows a fabrication process of the semiconductor device.
Figures 46A, 46B:
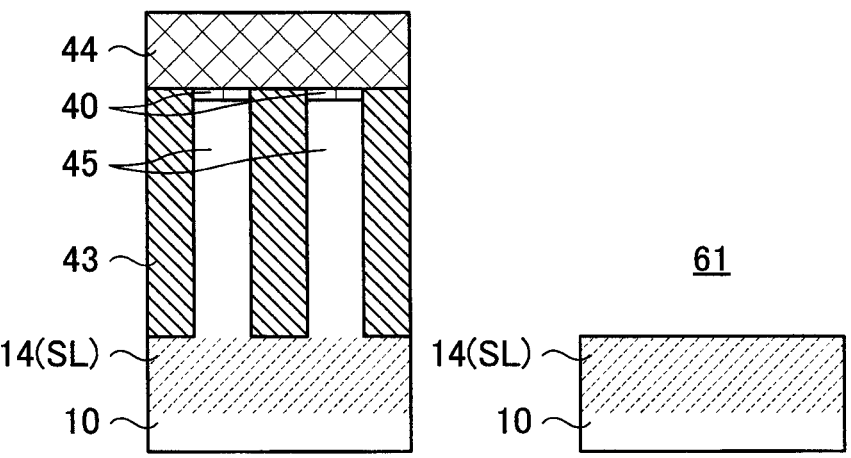
FIGS. 46A to 46D are sectional views corresponding to the cross sections taken along lines A-A, B-B, C-C, and D-D of FIG. 45, respectively.
Figures 46C, 46D:
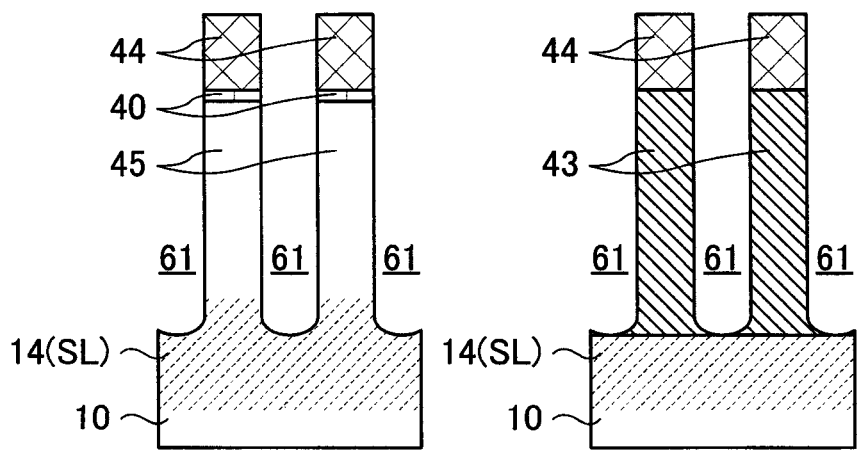

Next, the surface of the silicon substrate 10 including the side surfaces of the silicon pillars 45 is thermally oxidized to form a thin oxide film (not shown) of around 5 nm. An N-type impurity is then implanted into the bottoms of the trenches 61, followed by annealing to form the first impurity diffused layer 14 as shown in FIGS. 45 and 46. Incidentally, the first impurity diffused layer 14 may be formed by vapor-phase doping. A sidewall insulating film may be formed on the side surfaces of the silicon pillars 45 before the formation of the first impurity diffused layer 14.

Figure 47:
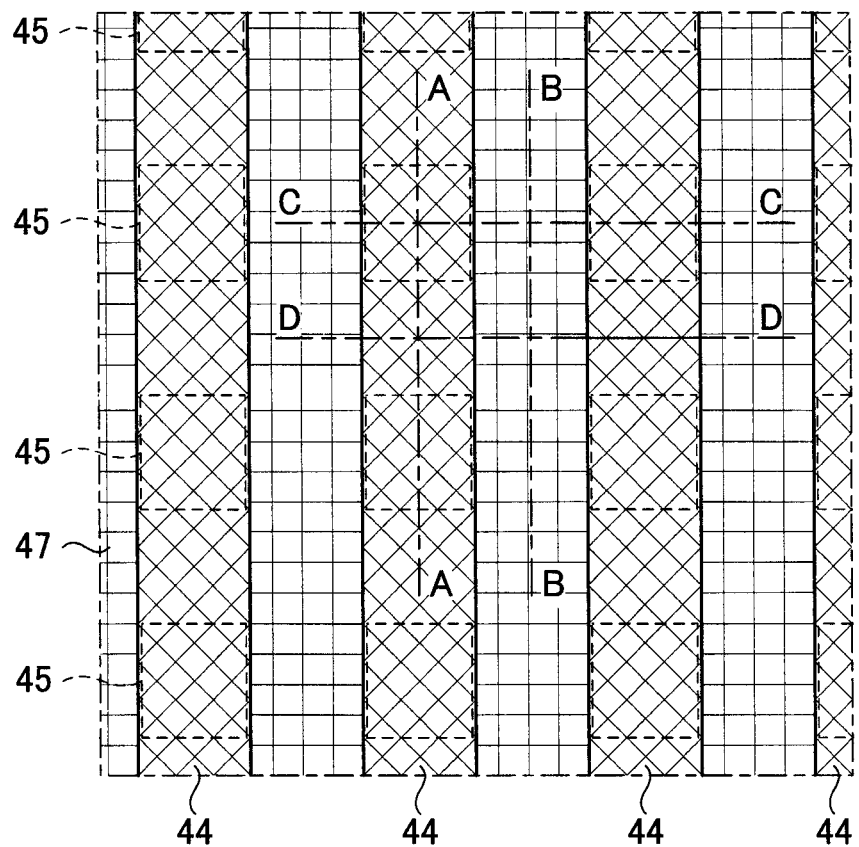
FIG. 47 is a plan view of the semiconductor device according to the second embodiment and shows a fabrication process of the semiconductor device.

Next, as shown in FIGS. 47 and 48, an insulating film (first insulating film) is deposited so as to fill the periphery of the silicon pillars 45 and the mask pattern 44. Specifically, a silicon nitride film 46 is deposited, followed by etchback with hot phosphoric acid. Subsequently, a silicon oxide film 47 is further deposited, and CMP is performed for surface flattening until the surface of the mask pattern 44 is exposed. The layered structure of the silicon nitride film and silicon oxide film is effective in forming a closely packed insulating film having a low wet etching rate in the narrow trenches.

Figure 49:
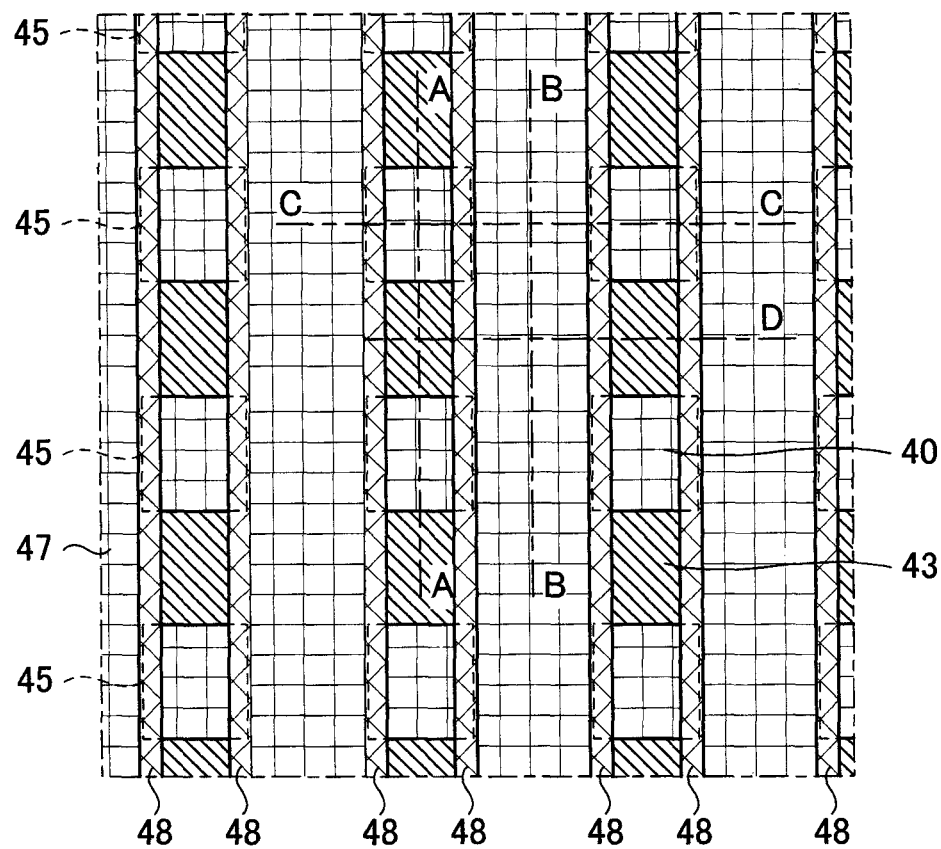
FIG. 49 is a plan view of the semiconductor device according to the second embodiment and shows a fabrication process of the semiconductor device.
Figure 50A:
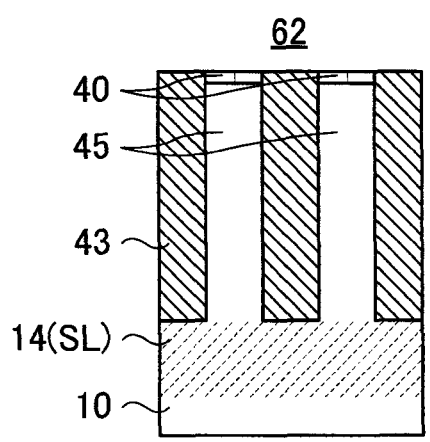
FIGS. 50A to 50D are sectional views corresponding to the cross sections taken along lines A-A, B-B, C-C, and D-D of FIG. 49, respectively.
Figure 50B:
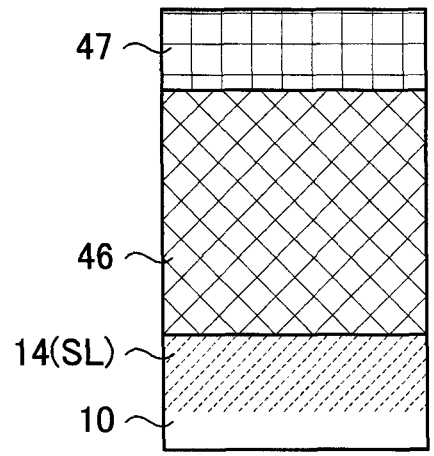
Figure 50C:
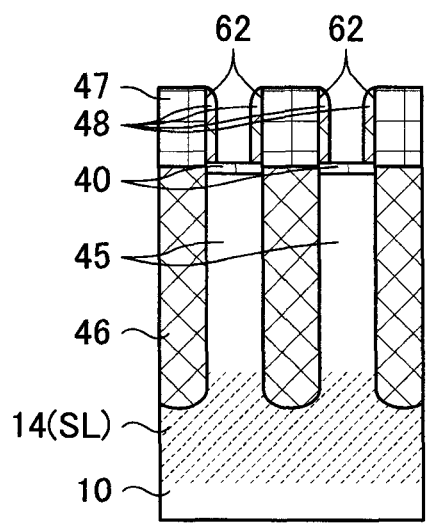
Figure 50D:
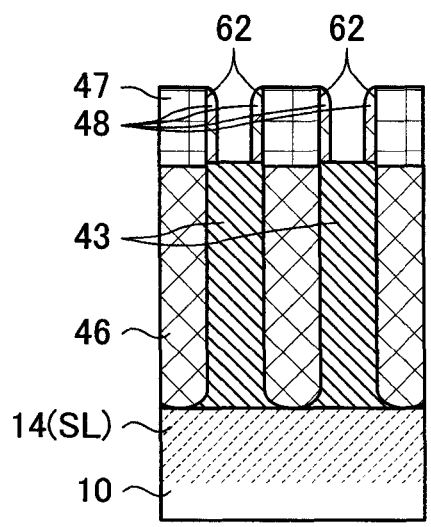

Next, the oxide film is wet etched. The mask pattern 44 is removed with hot phosphoric acid. A thin silicon nitride film is then deposited, followed by etchback. Consequently, as shown in FIGS. 49 and 50, a sidewall nitride film 48 having a thickness of around 7 nm is formed in openings 62 (first openings) that are formed by the removal of the mask pattern 44.

Figure 51:
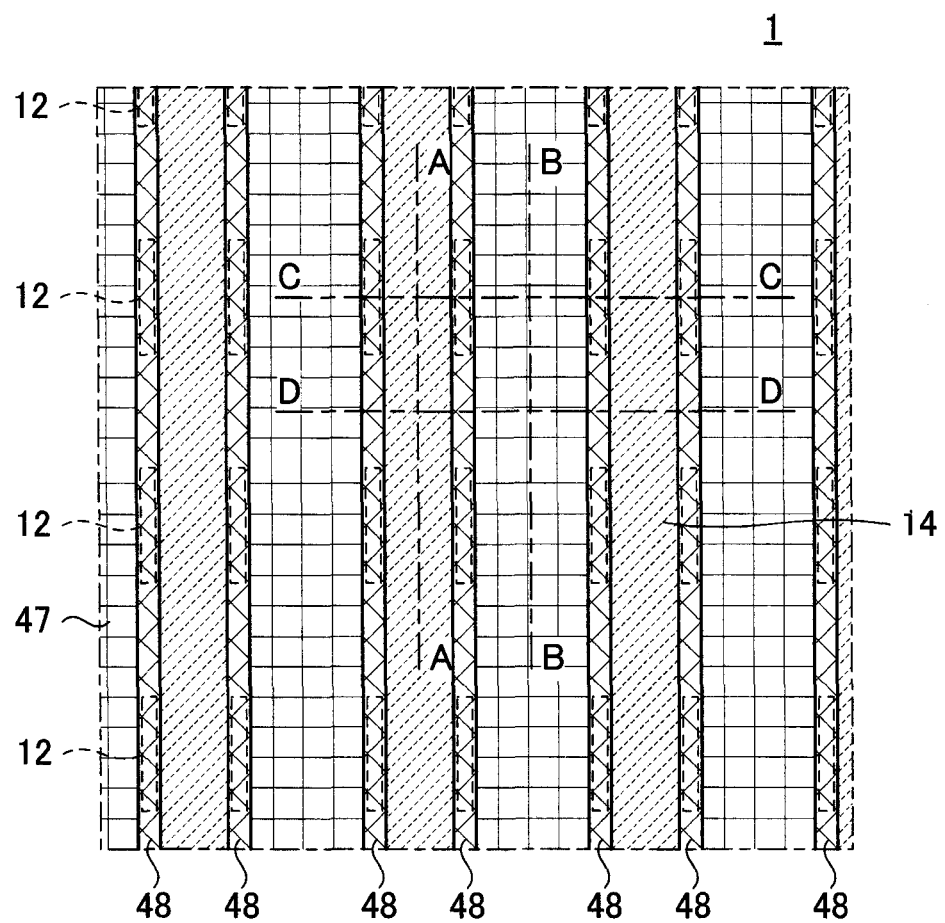
FIG. 51 is a plan view of the semiconductor device according to the second embodiment and shows a fabrication process of the semiconductor device.
Figure 52A:
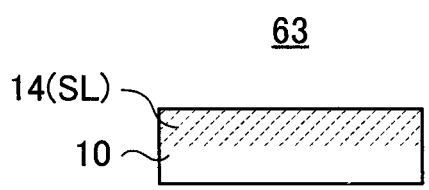
FIGS. 52A to 52D are sectional views corresponding to the cross sections taken along lines A-A, B-B, C-C, and D-D of FIG. 51, respectively.
Figure 52B:
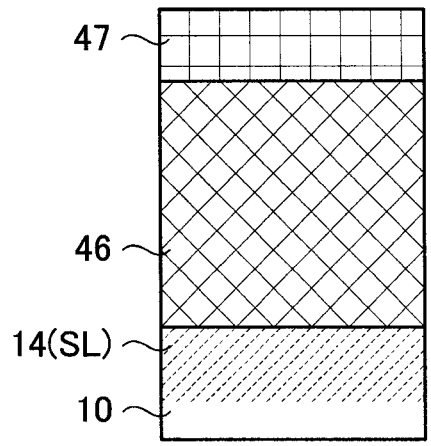
Figure 52C:
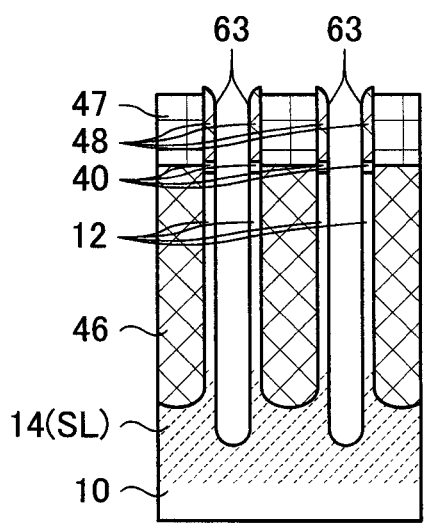
Figure 52D:
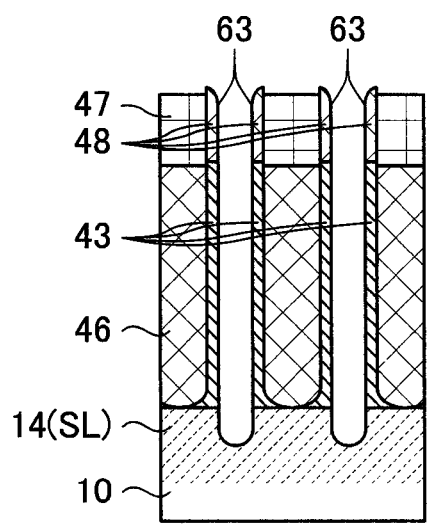

Next, using the sidewall nitride film 48 and the silicon oxide film 47 as a mask, the silicon pillars 45 and the DOPOS film 43 are etched to form trenches 63 (second openings) horizontally through the silicon pillars 45 as shown in FIGS. 51 and 52. The trenches 63 have a depth such that the top surface of the first impurity diffused layer 14 is exposed and the first impurity diffused layer 14 is not pierced through. Specifically, a depth of 250 nm to 300 nm is preferred. This forms part of the silicon pillars 12 that are each divided into two with the center line in the word line direction therebetween (the portions other than the upper end parts). It is preferred that the divided portions have a thickness below 5 nm. It should be noted that the etching also etches the silicon oxide film 47, whereas the etching selectivity and the thickness of the silicon oxide film 47 are appropriately adjusted so that the silicon oxide film 47 having a sufficient thickness for an interlayer insulating film is left after the etching.

Figure 53:
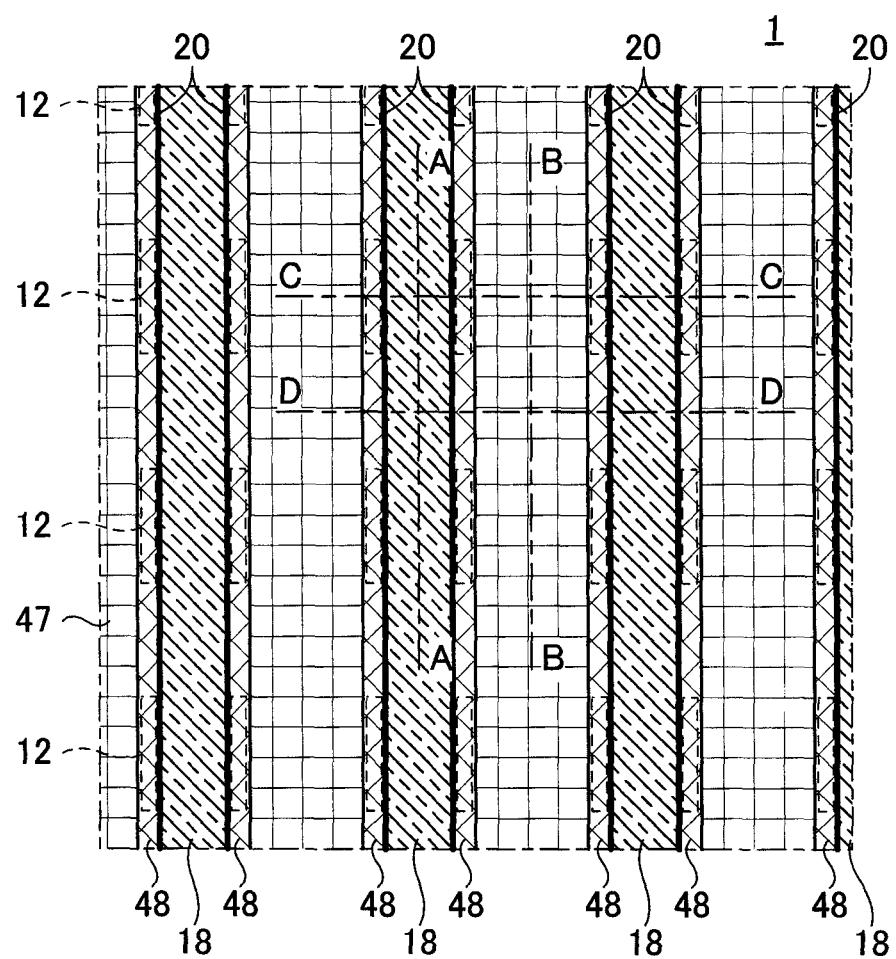
FIG. 53 is a plan view of the semiconductor device according to the second embodiment and shows a fabrication process of the semiconductor device.

Next, the inner walls of the trenches 63 are oxidized (gate oxidation) to form the gate insulating film 20 shown in FIGS. 53 and 54. Subsequently, deposition and etchback of a silicon nitride film and deposition and etchback of an N-type DOPOS film are performed in succession. Consequently, as shown in FIGS. 53 and 54, the gate electrodes 18 (word lines WL) which run horizontally through the silicon pillars 12 and the insulating film 24 which is intended to insulate the bottom surfaces of the gate electrodes 18 from the silicon substrate 10 and the silicon pillars 12 are formed in the trenches 63. It is preferred that the gate electrodes 18 have a thickness of around 100 nm.

Figure 55:
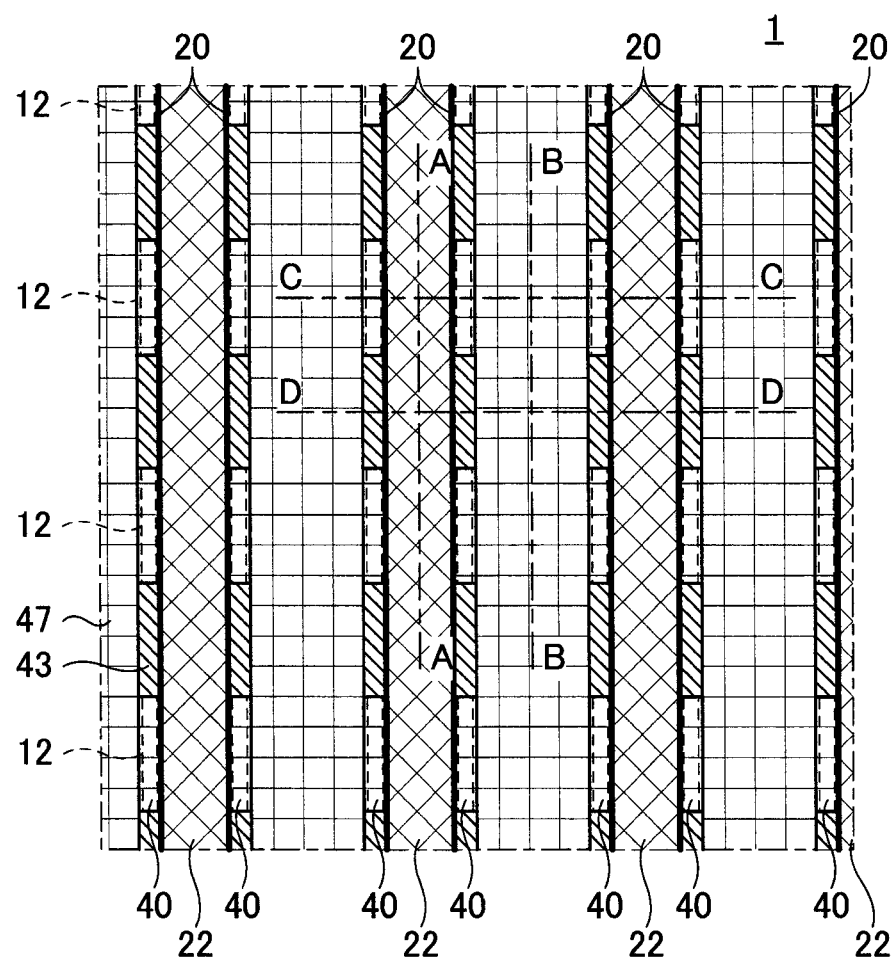
FIG. 55 is a plan view of the semiconductor device according to the second embodiment and shows a fabrication process of the semiconductor device.

A silicon nitride film is further deposited, followed by etchback with hot phosphoric acid. As shown in FIGS. 55 and 56, the insulating film 22 for insulating the top surfaces of the gate electrodes 18 from the silicon pillars 12 is thereby formed and the sidewall nitride film 48 is removed. It is preferred that the insulating film 22 has a thickness of around 50 nm.

Figure 57:
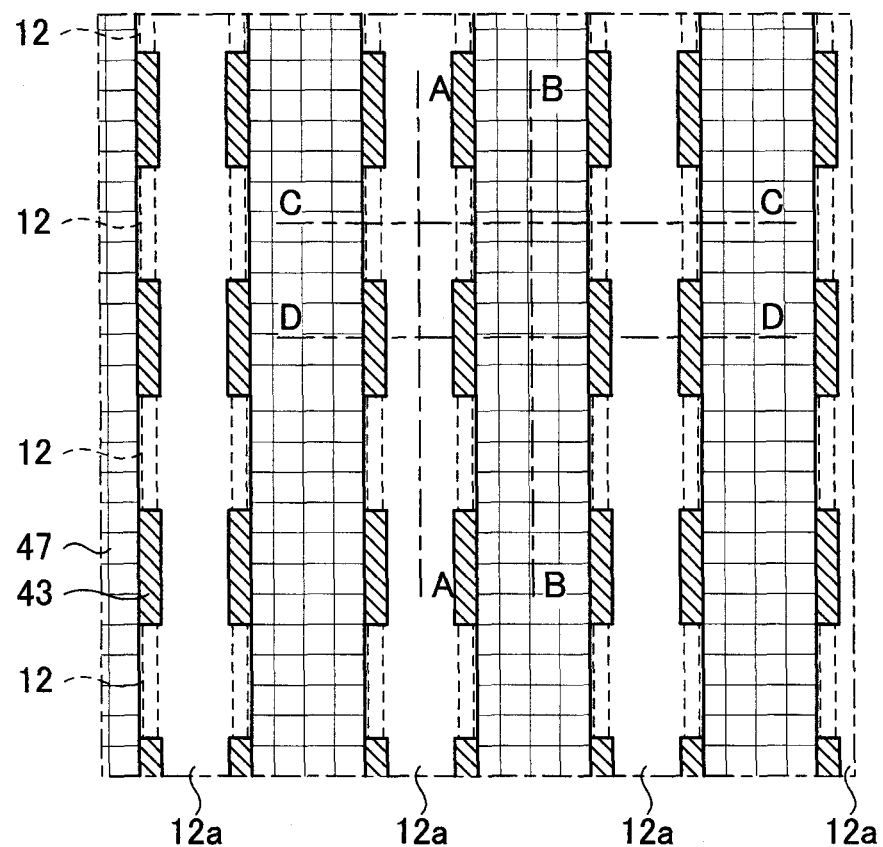
FIG. 57 is a plan view of the semiconductor device according to the second embodiment and shows a fabrication process of the semiconductor device.
Figure 59:
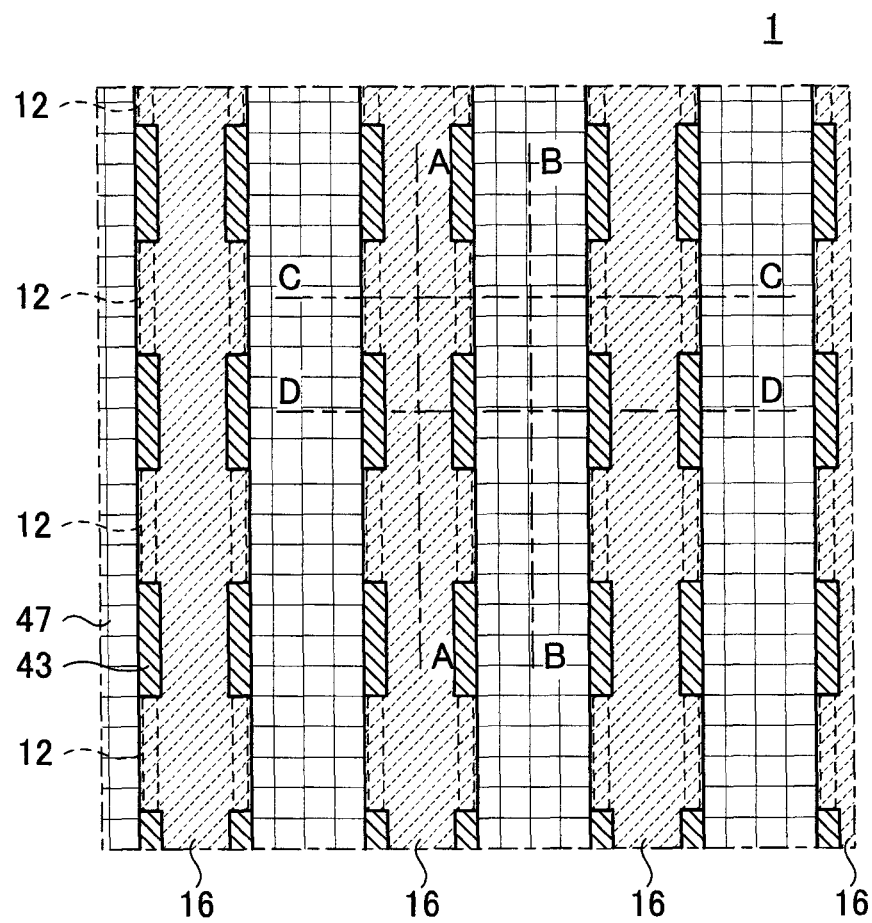
FIG. 59 is a plan view of the semiconductor device according to the second embodiment and shows a fabrication process of the semiconductor device.

Next, the silicon oxide film 40 and the exposed portions of the gate insulating film 20 are removed. The silicon pillars 12 are then extended upward to form upper end parts 12a as shown in FIGS. 57 and 58. Specifically, the portions of the silicon pillars 12 exposed on the inner walls of the trenches 63 are utilized for selective epitaxial growth of single crystal silicon. An N-type impurity is then implanted, followed by annealing. As shown in FIGS. 59 and 60, the second impurity diffused layers 16 are thereby formed in the upper end parts 12a.

After the formation of the second impurity diffused layers 16, non-doped amorphous silicon is deposited on the entire surface, and a P-type impurity ion is implanted to form a third impurity diffused layer 17 shown in FIG. 62. Subsequently, a layered film 51 of tungsten nitride (WN) and tungsten (W) is formed on the top surface of the third impurity diffused layer 17. A silicon nitride film is further deposited, followed by field PR (Photo Resist) to form a mask pattern 52 for forming bit lines.

Figure 61:
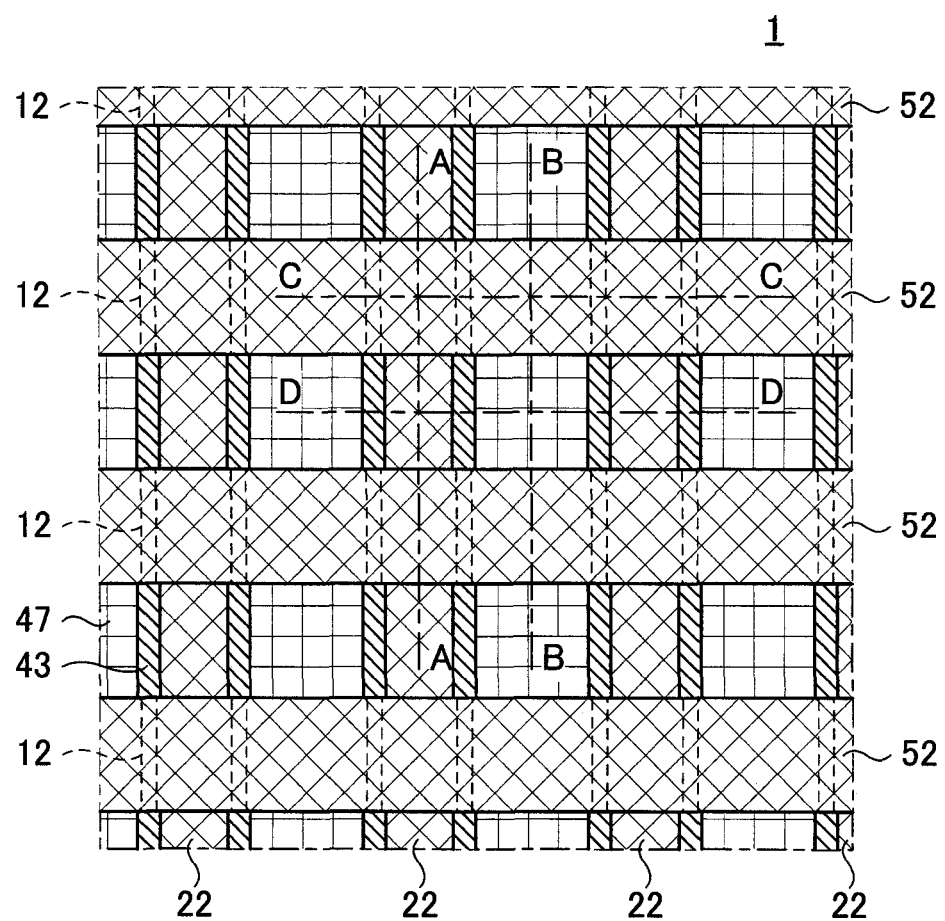
FIG. 61 is a plan view of the semiconductor device according to the second embodiment and shows a fabrication process of the semiconductor device.

After the formation of the mask pattern 52, the layered film 51, third impurity diffused layer 17, and second impurity diffused layer 16 are successively etched by dry etching. As shown in FIGS. 61 and 62, the layered film 51, the third impurity diffused layer 17, and the second impurity diffused layer 16 are thereby separated for each individual bit line BL. Here, it is preferred to perform over-etching so that the second impurity diffused layer 16 (FIG. 60(d)) formed in the areas between the bit lines BL is completely removed.

As has been described above, according to the present manufacturing method, the semiconductor device 1 having no capacitors in its memory cells can be provided with the word lines WL that run horizontally through the silicon pillars 12. Since the upper end parts 12a of the silicon pillars 12 are formed by using selective epitaxial growth, it is possible to suppress a rise in the contact resistance.

It is apparent that the present invention is not limited to the above embodiments, but may be modified and changed without departing from the scope and spirit of the invention.

For example, while the foregoing embodiments have dealt with the cases where the semiconductor device 1 is a DRAM, the present invention may be applied to other types of semiconductor devices such as a PRAM (Phase change Random Access Memory).

In the foregoing embodiments, the first and second conductivity types are N- and P-types, respectively. Such correspondence may be inverted, however. For example, in the case of the first embodiment, the semiconductor device 1 may be formed in and over an N-type area NWELL which is formed in the surface of the silicon substrate 10. The first and second impurity diffused layers 14 and 16 may be P-type impurity diffused layers.

In addition, while not specifically claimed in the claim section, the applicant reserves the right to include in the claim section of the application at any appropriate time the following methods:

A1. A method of manufacturing a semiconductor device, comprising:
etching a silicon substrate by using a mask insulating film to form a silicon pillar;
forming a first impurity diffusion layer in a lower part of the silicon pillar;
depositing a first insulating film so as to fill a periphery of the silicon pillar and the mask insulating film;
removing the mask insulating film so as to form a first opening;
forming a sidewall insulating film on an inner wall of the first opening that is formed by the removal of the mask insulating film;
etching the silicon pillar by using the sidewall insulating film and the first insulating film as a mask so as to form a second opening;
forming a gate insulating film by oxidizing an inner wall of the second opening that is formed by the etching of the silicon pillar;
forming a gate electrode in the second opening, at least an upper part of the gate electrode being covered by a second insulating film; and
forming a second impurity diffusion layer that is in contact with an upper end of the silicon pillar and an upper end of the second insulating film.

A2. The method of manufacturing a semiconductor device as claimed in claim A1, wherein
the forming the second impurity diffusion layer includes:
growing, by selective epitaxial growth, silicon that is in contact with the upper end of the silicon pillar and the upper end of the second insulating film; and
implanting an impurity into the silicon.

A3. The method of manufacturing a semiconductor device as claimed in claim A1, further comprising forming a capacitor that has an electrode electrically connected to the second impurity diffusion layer.

A4. The method of manufacturing a semiconductor device as claimed in claim A1, wherein:
the semiconductor device is a memory device using a word line and a bit line that are substantially orthogonal to each other;
the gate electrode and the first impurity diffusion layer constitute the word line and the bit line, respectively; and
the forming the silicon pillar and the first impurity diffusion layer includes:
etching the silicon substrate by using a first mask insulating film that extends in a bit line direction,
implanting an impurity into a bottom of a third opening that is formed by the etching of the silicon substrate,
forming the first impurity diffusion layer by etching the silicon substrate and the first impurity diffusion layer by using the first mask insulating film,
depositing a third insulating film so as to fill an interior of the third opening,
removing the first mask insulating film, and forming a second mask insulating film that extends in a word line direction, and
etching the silicon substrate and the third insulating film by using the second mask insulating film to a depth such that the first impurity diffusion layer is not pierced through, thereby forming the silicon pillar.

A5. The method of manufacturing a semiconductor device as claimed in claim A1, further comprising:
forming a third impurity diffusion layer that is in contact with an upper end of the second impurity diffusion layer; and
forming a wiring pattern that is in contact with an upper end of the third impurity diffusion layer, and wherein
the first and second impurity diffusion layers are made of silicon and an impurity of first conductivity type implanted into the silicon, and
the third impurity diffusion layer is made of silicon and an impurity of second conductivity type implanted into the silicon.

A6. The method of manufacturing a semiconductor device as claimed in claim A1, wherein:
the semiconductor device is a memory device using a word line and a bit line that are orthogonal to each other;
the gate electrode and the wiring pattern constitute the word line and the bit line, respectively; and
the forming the silicon pillar and the first impurity diffusion layer includes:
etching the silicon substrate by using a first mask insulating film that extends in a bit line direction,
depositing a third insulating film so as to fill an interior of a third opening that is formed by the etching of the silicon substrate,
removing the first mask insulating film, and forming a second mask insulating film that extends in a word line direction,
forming the silicon pillar by etching the silicon substrate and the third insulating film by using the second mask insulating film, and
forming the first impurity diffusion layer by implanting an impurity into a surface of the silicon substrate lying below the silicon pillar.

A7. The method of manufacturing a semiconductor device as claimed in claim A1, wherein a plurality of the silicon pillars are formed in a matrix configuration.

What is claimed is:
1. A semiconductor device comprising: a semiconductor substrate; a plurality of first wirings each extending in a first direction; a plurality of second wirings each extending in a second direction perpendicular to the first direction; a plurality of first impurity diffusion layers; a plurality of silicon pillars; and a plurality of transistors arranged at intersections of the first wirings and the second wirings in a matrix configuration, wherein each of the transistors includes one of the silicon pillars projecting perpendicularly from a main surface of the semiconductor substrate; one of the first impurity diffusion layers formed in a lower part of the silicon pillar; and a second impurity diffusion layer formed in an upper part of the silicon pillar, a central part of the silicon pillar is divided into a first divided portion and a second divided portion, the lower part of the silicon pillar being connected with both of the first and second divided portions, the upper part of the silicon pillar being connected with both of the first and second divided portions, each of the first impurity diffusion layers diffuses into the semiconductor substrate so as to be continuous between the silicon pillars adjoining in the first direction, each of the first wirings being constituted by the first impurity diffusion layers continuous in the first direction, and each of the second wirings is arranged between the first and second divided portions of the corresponding transistors.

2. The semiconductor device as claimed in claim 1, wherein
each of the transistors further includes a gate insulating film formed between the corresponding second wiring and each of the corresponding first and second divided portions, the corresponding second wiring constituting a gate electrode common to the corresponding first and second divided portions.

3. The semiconductor device as claimed in claim 2, wherein
in case one of the second wirings is activated, channels electrically connecting the corresponding first and second impurity diffusion layers are formed in the corresponding first and second divided portions.

4. The semiconductor device as claimed in claim 1, wherein
each of the transistors further includes an upper insulating film being arranged between a bottom surface of the corresponding second wiring and a top surface of the corresponding first impurity diffusion layer, and
a lower insulating film being arranged between a top surface of each of the corresponding second wiring and a bottom surface of the corresponding second impurity diffusion layer.

5. The semiconductor device as claimed in claim 1, further comprising capacitors being provided for each of the transistors, wherein
each of the capacitors has an electrode electrically connected to the corresponding second impurity diffusion layer.

6. The semiconductor device as claimed in claim 5, wherein each of the first wirings is a bit line, and each of the second wirings is a word line.

7. A semiconductor device comprising: a semiconductor substrate; a plurality of first wirings each extending in a first direction; a plurality of second wirings each extending in a second direction perpendicular to the first direction; a plurality of first impurity diffusion layers; a plurality of silicon pillars; and a plurality of transistors arranged at intersections of the first wirings and the second wirings in a matrix configuration, wherein each of the transistors includes one of the silicon pillars projecting perpendicularly from a main surface of the semiconductor substrate; one of the first impurity diffusion layers formed in a lower part of the silicon pillar; and a second impurity diffusion layer formed in an upper part of the silicon pillar, a central part of the silicon pillar is divided into a first divided portion and a second divided portion, the lower part of the silicon pillar being connected with both of the first and second divided portions, the upper part of the silicon pillar being connected with both of the first and second divided portions, each of the first impurity diffusion layers diffuses into the semiconductor substrate so as to be continuous between the silicon pillars adjoining in the first direction, each of the first wirings being constituted by the first impurity diffusion layers continuous in the first direction, each of the second wirings is arranged between the first and second divided portions of the corresponding transistors, and the second wirings are not provided between the silicon pillars adjoining each other in the first direction.

8. The semiconductor device as claimed in claim 7, wherein the second impurity diffusion layers adjoining each other in the first direction are separated by an insulating film.

9. The semiconductor device as claimed in claim 7, wherein
each of the transistors further includes a gate insulating film formed between the corresponding second wiring and each of the corresponding first and second divided portions, the corresponding second wiring constituting a gate electrode common to the corresponding first and second divided portions.

10. The semiconductor device as claimed in claim 9, wherein
in case one of the second wirings is activated, channels electrically connecting the corresponding first and second impurity diffusion layers are formed in the corresponding first and second divided portions.

11. The semiconductor device as claimed in claim 7, wherein
each of the transistors further includes an upper insulating film being arranged between a bottom surface of the corresponding second wiring and a top surface of the corresponding first impurity diffusion layer, and
a lower insulating film being arranged between a top surface of each of the corresponding second wiring and a bottom surface of the corresponding second impurity diffusion layer.

12. The semiconductor device as claimed in claim 7, further comprising capacitors being provided for each of the transistors, wherein
each of the capacitors has an electrode electrically connected to the corresponding second impurity diffusion layer.

13. The semiconductor device as claimed in claim 12, wherein
each of the first wirings is a bit line, and each of the second wirings is a word line.

14. A semiconductor device comprising: a semiconductor substrate; a plurality of bit lines each extending in a first direction; a plurality of word lines each extending in a second direction perpendicular to the first direction; a plurality of first impurity diffusion layers; a plurality of silicon pillars; and a plurality of transistors arranged at the intersections of the bit lines and the word lines in a matrix configuration, wherein each of the transistors includes one of the silicon pillars projecting perpendicularly from a main surface of the semiconductor substrate; one of the first impurity diffusion layers formed in a lower part of the silicon pillar; and a second impurity diffusion layer formed in an upper part of the silicon pillar, a central part of the silicon pillar is divided into a first divided portion and a second divided portion, the lower part of the silicon pillar being connected with both of the first and second divided portions, the upper part of the silicon pillar being connected with both of the first and second divided portions, each of the first impurity diffusion layers diffuses into the semiconductor substrate so as to be continuous between the silicon pillars adjoining in the first direction, each of the bit lines being constituted by the first impurity diffusion layers continuous in the first direction, and each of the word lines is arranged between the first and second divided portions of the corresponding transistors.

15. The semiconductor device as claimed in claim 14, wherein
the word lines are not provided between the silicon pillars adjoining each other in the first direction.

16. The semiconductor device as claimed in claim 14, wherein
the second impurity diffusion layers adjoining each other in the first direction are separated by an insulating film.

17. The semiconductor device as claimed in claim 14, wherein
each of the transistors further includes a gate insulating film formed between the corresponding word line and each of the corresponding first and second divided portions, the corresponding word line constituting a gate electrode common to the corresponding first and second divided portions.

18. The semiconductor device as claimed in claim 17, wherein in case one of the second wirings is activated, channels electrically connecting the corresponding first and second impurity diffusion layers are formed in the corresponding first and second divided portions.

19. The semiconductor device as claimed in claim 14, wherein each of the transistors further includes an upper insulating film being arranged between a bottom surface of the corresponding word line and a top surface of the corresponding first impurity diffusion layer, and a lower insulating film being arranged between a top surface of each of the corresponding word line and a bottom surface of the corresponding second impurity diffusion layer.

20. The semiconductor device as claimed in claim 14, further comprising capacitors being provided for each of the transistors, wherein each of the capacitors has an electrode electrically connected to the corresponding second impurity diffusion layer.

* * * * *